(12) United States Patent
Park et al.

(10) Patent No.: US 11,476,176 B2
(45) Date of Patent: Oct. 18, 2022

(54) SEMICONDUCTOR DEVICE HAVING VIA PROTECTIVE LAYER

(71) Applicant: Samsung Electronics Co., Ltd., Suwon-si (KR)

(72) Inventors: Jumyong Park, Cheonan-si (KR); Solji Song, Suwon-si (KR); Jinho An, Seoul (KR); Jeonggi Jin, Seoul (KR); Jinho Chun, Seoul (KR); Juil Choi, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 102 days.

(21) Appl. No.: 17/035,145

(22) Filed: Sep. 28, 2020

(65) Prior Publication Data

US 2021/0335688 A1 Oct. 28, 2021

(30) Foreign Application Priority Data

Apr. 22, 2020 (KR) .................. 10-2020-0048644

(51) Int. Cl.
| | |
|---|---|
| *H01L 29/40* | (2006.01) |
| *H01L 23/31* | (2006.01) |
| *H01L 23/48* | (2006.01) |
| *H01L 23/00* | (2006.01) |
| *H01L 21/768* | (2006.01) |
| *H01L 21/321* | (2006.01) |
| *H01L 23/29* | (2006.01) |
| *H01L 21/3105* | (2006.01) |

(52) U.S. Cl.
CPC .... *H01L 23/3192* (2013.01); *H01L 21/76898* (2013.01); *H01L 23/3171* (2013.01); *H01L 23/481* (2013.01); *H01L 24/05* (2013.01); *H01L 21/31053* (2013.01); *H01L 21/3212* (2013.01); *H01L 23/293* (2013.01); *H01L 2224/05025* (2013.01); *H01L 2224/0557* (2013.01); *H01L 2224/05073* (2013.01); *H01L 2224/05573* (2013.01)

(58) Field of Classification Search
CPC combination set(s) only.
See application file for complete search history.

(56) References Cited

U.S. PATENT DOCUMENTS

| | | |
|---|---|---|
| 8,962,474 B2 | 2/2015 | Yu et al. |
| 9,034,752 B2 | 5/2015 | Li et al. |
| 9,666,551 B1 * | 5/2017 | Seo .................. H01L 24/14 |

(Continued)

FOREIGN PATENT DOCUMENTS

| | | | |
|---|---|---|---|
| KR | 101342665 B1 | | 12/2013 |
| KR | 10-1840447 | * | 3/2018 |
| KR | 101840447 B1 | * | 3/2018 |

*Primary Examiner* — Niki H Nguyen
(74) *Attorney, Agent, or Firm* — Muir Patent Law, PLLC

(57) ABSTRACT

A semiconductor device is disclosed. The semiconductor device includes a via passivation layer disposed on an inactive surface of a substrate, a through-electrode vertically penetrating the substrate and the via passivation layer, a concave portion formed in the top surface of the via passivation layer and disposed adjacent to the through-electrode, and a via protective layer coplanar with the via passivation layer and the through-electrode and to fill the concave portion. In a horizontal cross-sectional view, the via protective layer has a band shape surrounding the through-electrode.

19 Claims, 17 Drawing Sheets

(56) References Cited

U.S. PATENT DOCUMENTS

| | | | |
|---|---|---|---|
| 9,735,090 B2 | 8/2017 | Choi et al. | |
| 9,786,580 B2 | 10/2017 | Yang et al. | |
| 9,805,977 B1 | 10/2017 | Sukumaran et al. | |
| 10,163,756 B2* | 12/2018 | Chang | H01L 24/13 |
| 2006/0001174 A1* | 1/2006 | Matsui | H01L 25/0657 |
| | | | 257/E23.079 |
| 2009/0243074 A1* | 10/2009 | Ramiah | H01L 21/76898 |
| | | | 438/109 |
| 2012/0205816 A1* | 8/2012 | Son | H01L 23/293 |
| | | | 257/774 |
| 2013/0115769 A1* | 5/2013 | Yu | H01L 21/76898 |
| | | | 257/E21.597 |
| 2013/0200525 A1* | 8/2013 | Lee | H01L 23/481 |
| | | | 257/774 |
| 2015/0123278 A1* | 5/2015 | Park | H01L 24/03 |
| | | | 257/774 |
| 2016/0020184 A1* | 1/2016 | Park | H01L 24/05 |
| | | | 257/737 |
| 2016/0086874 A1* | 3/2016 | Choi | H01L 21/76898 |
| | | | 257/774 |
| 2017/0025384 A1* | 1/2017 | Park | H01L 23/481 |
| 2018/0218966 A1* | 8/2018 | Choi | H01L 24/03 |
| 2019/0304799 A1 | 10/2019 | Gandhi et al. | |

\* cited by examiner

II-II'

SEMICONDUCTOR DEVICE HAVING VIA PROTECTIVE LAYER

CROSS-REFERENCE TO THE RELATED APPLICATION

This application claims the benefit of priority under 35 U.S.C. § 119 to Korean Patent Application No. 10-2020-0048644, filed on Apr. 22, 2020, in the Korean Intellectual Property Office, the disclosure of which is incorporated herein by reference in its entirety.

BACKGROUND

1. Field

The disclosure relates to a semiconductor device having a via protective layer.

2. Description of the Related Art

As three-dimensional (3D) packages, in which a plurality of semiconductor chips is mounted in a single semiconductor device, have been actively developed, through-silicon-via (TSV) technology for forming a vertical electrical connection through a substrate or a die has come to be considered very important. A TSV-forming process includes a chemical-mechanical polishing (CMP) process for exposing a TSV. There is the need for technology for preventing damage to a TSV during the CMP process.

SUMMARY

Exemplary embodiments of the disclosure provide a semiconductor device including a via protective layer.

A semiconductor device in accordance with an exemplary embodiment of the disclosure may include a via passivation layer disposed on an inactive surface of a substrate, a through-electrode vertically penetrating the substrate and the via passivation layer, a concave portion formed in the top surface of the via passivation layer, the concave portion being adjacent to the through-electrode, and a via protective layer horizontally overlapping the via passivation layer and the through-electrode and to fill the concave portion. In a horizontal cross-sectional view, the via protective layer may have a band shape surrounding the through-electrode.

A semiconductor device in accordance with an exemplary embodiment of the disclosure may include a via passivation layer disposed on an inactive surface of a substrate, a first through-electrode and a second through-electrode vertically penetrating the substrate and the via passivation layer, the second through-electrode having a horizontal width larger than a horizontal width of the first through-electrode, a first concave portion and a second concave portion formed in the top surface of the via passivation layer, the first concave portion being adjacent to the first through-electrode and the second concave portion being adjacent to the second through-electrode, a first via protective layer filling the first concave portion, and a second via protective layer filling the second concave portion. In a horizontal cross-sectional view, the first via protective layer and the second via protective layer may have band shapes surrounding the first through-electrode and the second through-electrode, respectively.

A semiconductor device in accordance with an exemplary embodiment of the disclosure may include a substrate including an inactive surface and an active surface formed opposite the inactive surface, an interlayer insulating layer disposed below the active surface, a wiring structure disposed below the interlayer insulating layer, a lower passivation layer including a lower horizontal portion disposed on the inactive surface, a lower vertical portion connected to the lower horizontal portion, and a lower concave portion formed between the lower horizontal portion and the lower vertical portion, an upper passivation layer disposed on the lower passivation layer, the upper passivation layer including an upper horizontal portion disposed on the lower horizontal portion, an upper vertical portion connected to the upper horizontal portion, and an upper concave portion formed between the upper horizontal portion and the upper vertical portion, the upper vertical portion being in contact with a side surface of the lower vertical portion, a through-electrode vertically penetrating the substrate, the lower passivation layer, the upper passivation layer, and the interlayer insulating layer, and a via protective layer horizontally overlapping the upper horizontal portion, the upper vertical portion, and the through-electrode and to fill the upper concave portion. In a horizontal cross-sectional view, the via protective layer may have a band shape surrounding the through-electrode.

A method of manufacturing a semiconductor device in accordance with an exemplary embodiment of the disclosure may include forming a through-hole vertically penetrating a substrate, forming a through-electrode in the through-hole, etching the substrate to expose a portion of the through-electrode, forming a via passivation layer covering the substrate and the through-electrode, forming a via protective material covering the via passivation layer and filling a concave portion in the via passivation layer, and performing a polishing process to form a via protective layer by flattening the through-electrode, the via passivation layer, and the via protective material.

BRIEF DESCRIPTION OF THE DRAWINGS

The above and other objects, features, and advantages of the inventive concept will become more apparent to those skilled in the art upon consideration of the following detailed description taken together with the accompanying drawings.

DETAILED DESCRIPTION OF EXEMPLARY EMBODIMENTS

Figure 1:
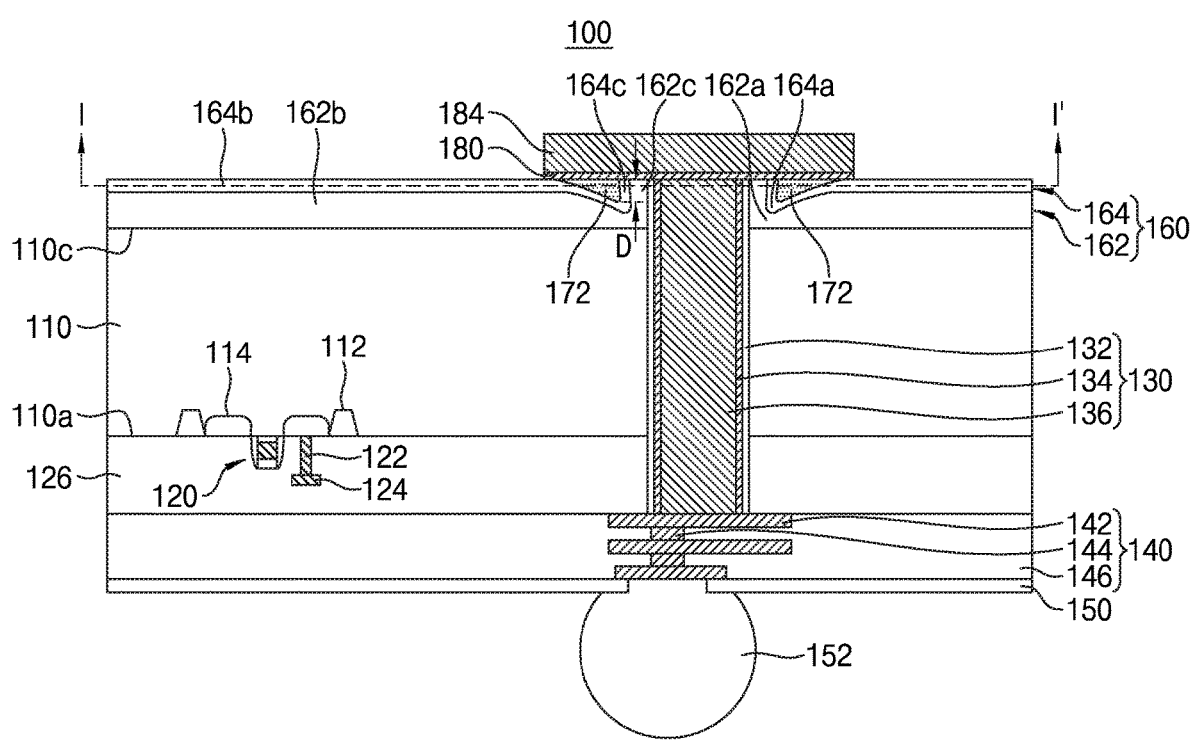
FIG. 1 is a vertical cross-sectional view of a semiconductor device, according to an example embodiment of the inventive concepts.

FIG. 1 is a vertical cross-sectional view of a semiconductor device, according to an example embodiment of the inventive concepts.

Figure 2:
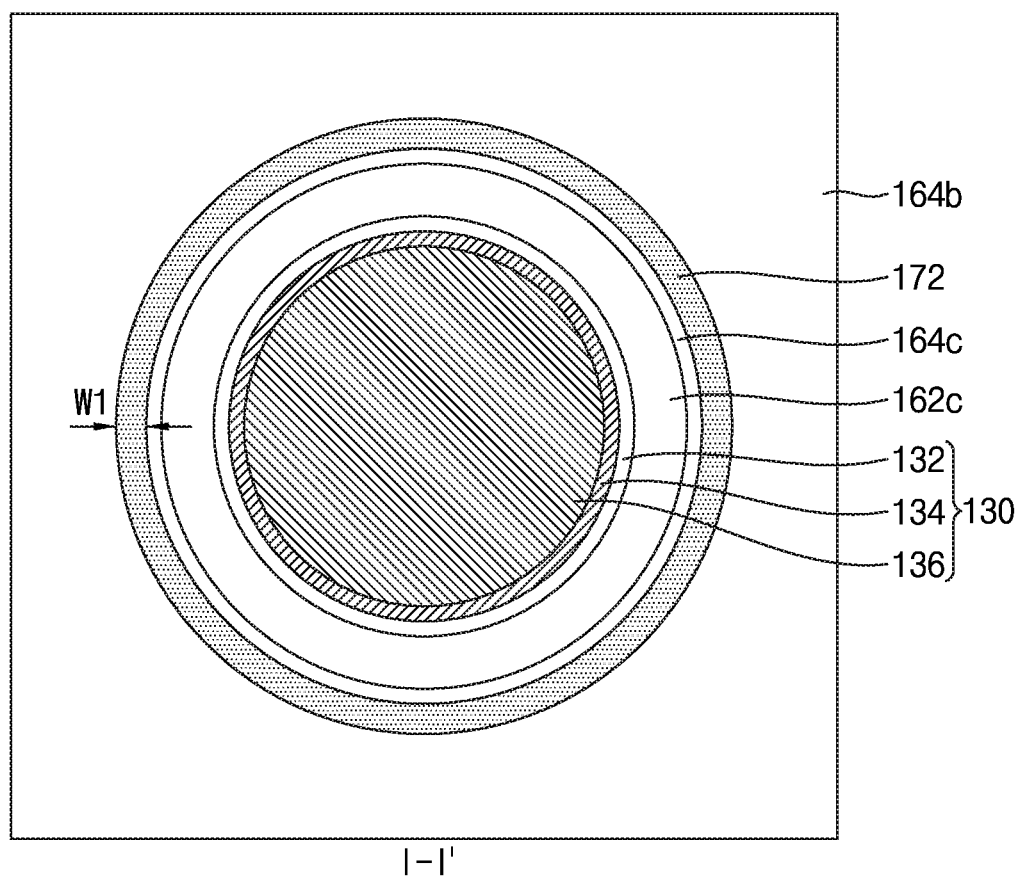
FIG. 2 is a horizontal cross-sectional view of the semiconductor device shown in FIG. 1, taken along line I-I'.

FIG. 2 is a horizontal cross-sectional view of the semiconductor device shown in FIG. 1, taken along line I-I'.

Referring to FIGS. 1 and 2, a semiconductor device 100 may include a substrate 110, a transistor 120, a through-electrode 130, a wiring structure 140, an insulating layer 150, an external connection terminal 152, a via passivation layer 160, a via protective layer 172, and a conductive pad 184.

The substrate 110 may include an active surface 110a and an inactive surface 110c, which is the surface formed opposite the active surface 110a. The inactive surface may be the surface which does not include any devices, and the active surface may be the surface on which devices are formed. The substrate 110 may include a device isolation layer 112 and an impurity region 114 formed on the active surface 110a. The device isolation layer 112 may be formed adjacent to an external side surface of the impurity region 114. The substrate 110 may include a semiconductor material. For example, the substrate 110 may be a silicon substrate, a germanium substrate, a silicon germanium substrate, or a silicon-on-insulator (SOI) substrate. In an example embodiment, the substrate may include a group IV semiconductor, a group III-V compound semiconductor, or a group II-VI oxide semiconductor.

The transistor 120 may be disposed on the active surface 110a of the substrate 110 so as to be adjacent to the impurity region 114. For example, the impurity region 114 may be formed on both sides of the transistor 120. The semiconductor device 100 may further include a contact plug 122, an internal line 124, and an interlayer insulating layer 126. The contact plug 122 may be connected to the impurity region 114, and the internal line 124 may be connected to the contact plug 122. The interlayer insulating layer 126 may cover the active surface 110a of the substrate 110, the transistor 120, the contact plug 122, and the internal line 124.

The through-electrode 130 may vertically penetrate the substrate 110, the interlayer insulating layer 126, and the via passivation layer 160. The through-electrode 130 may include a via insulating layer 132, a via barrier layer 134, and a conductive via 136. The via barrier layer 134 may cover and contact the side surface of the conductive via 136, and the via insulating layer 132 may cover and contact the side surface of the via barrier layer 134. In a horizontal cross-sectional view, the through-electrode 130 may have a circular shape, without being limited thereto. In an example embodiment, the horizontal width of the through-electrode 130 may range from 1 μm to 5 μm. For example, the diameter of the through-electrode 130 may range from 1 μm to 5 μm.

The wiring structure 140 may be disposed on the bottom surface of the interlayer insulating layer 126. The wiring structure 140 may be composed of a single layer or multiple layers. For example, the wiring structure 140 may include wiring layers 142, a contact plug 144 connecting the wiring layers 142 to each other, and an interlayer insulating layer 146 covering the wiring layers 142 and the contact plug 144. The wiring layers 142 may be electrically connected to the through-electrode 130.

The insulating layer 150 may be disposed on the bottom surface of the wiring structure 140. The insulating layer 150 may cover the bottom surface of the interlayer insulating layer 146, and may expose a portion of the wiring layer 142.

The external connection terminal 152 may be connected to the portion of the wiring layer 142 that is exposed by the insulating layer 150. The external connection terminal 152 may be electrically connected to the through-electrode 130 via the wiring structure 140.

The via passivation layer 160 may be disposed on the inactive surface 110c of the substrate 110, and may cover the side surface of the through-electrode 130. The via passivation layer 160 may include a lower passivation layer 162 and an upper passivation layer 164. The lower passivation layer 162 may be in contact with the inactive surface 110c of the substrate 110 and the side surface of the through-electrode 130. In a vertical cross-sectional view, the lower passivation layer 162 may have a bent shape. For example, the lower passivation layer 162 may include a lower concave portion 162a formed in the top surface thereof, a lower horizontal portion 162b extending in a horizontal direction, and a lower vertical portion 162c that is in contact with the through-electrode 130. The lower concave portion 162a may be disposed adjacent to the through-electrode 130. For example, the lower concave portion 162a may be formed in a corner between the lower horizontal portion 162b and the lower vertical portion 162c. The lower concave portion 162a may extend along the circumference of the through-electrode 130, and may have a rounded cross-section. In a horizontal cross-sectional view, the top surface of the lower vertical portion 162c may have a band shape, a ring shape, a donut shape, or an annular shape, and may surround the through-electrode 130.

The upper passivation layer 164 may be disposed on the lower passivation layer 162. In some embodiments, the upper passivation layer 164 may be conformally formed on a top surface of the lower passivation layer 162. A portion of the upper passivation layer 164 may be located at a lower level than the lower passivation layer 162. For example, a portion of the upper passivation layer 164 may be located at a lower vertical level than a top surface of the lower horizontal portion 162b of the lower passivation layer 162. In a vertical cross-sectional view, the upper passivation layer 164 may have a bent shape. For example, the upper passivation layer 164 may include an upper concave portion 164a formed in the top surface thereof, an upper horizontal portion 164b extending in a horizontal direction, and an upper vertical portion 164c that is in contact with the lower vertical portion 162c. The upper concave portion 164a may be disposed adjacent to the through-electrode 130. The lower vertical portion 162c may be provided between the through-electrode 130 and the upper concave portion 164a. For example, the upper concave portion 164a may be formed in a corner between the upper horizontal portion 164b and the upper vertical portion 164c. The upper concave portion 164a may extend along the circumference of the lower concave portion 162a, and may have a rounded cross-section. In a horizontal cross-sectional view, the top surface of the upper vertical portion 164c may have a band shape, a ring shape, a donut shape, or an annular shape, and may surround the lower vertical portion 162c. In a horizontal cross-sectional view, the upper horizontal portion 164b may surround the via protective layer 172. The top surface of the upper vertical portion 164c and the top surface of the upper horizontal portion 164b may be located at substantially the same level. In this specification, the lower concave portion 162a and the upper concave portion 164a may be collectively referred to as a concave portion. In an example embodiment, the via passivation layer 160 may be composed of one layer, and may include tetraethylorthosilicate (TEOS). In an example embodiment, the lower passivation layer 162 and the upper passivation layer 164 may include a combination of SiOx/SiN, SiN/SiOx, SiOx/SiCN, or SiN/SiCN.

The via protective layer 172 may be disposed on the top surface of the via passivation layer 160. For example, the via protective layer 172 may fill the upper concave portion 164a. The via protective layer 172 may be coplanar with the through-electrode 130 and the via passivation layer 160. For example, the top surfaces of the through-electrode 130, the lower vertical portion 162c, the upper vertical portion 164c, the via protective layer 172, and the upper horizontal portion 164b may be coplanar with each other. The via protective layer 172 may horizontally overlap portions of the through-electrode 130 and the via passivation layer 160. The top surface of the via protective layer 172 may be substantially flat, and the bottom surface thereof may be a curved surface that is convex downwards. In a horizontal cross-sectional view, the via protective layer 172 may surround the through-electrode 130, particularly the upper vertical portion 164c. The via protective layer 172 may have a band shape, a ring shape, a donut shape, or an annular shape, without being limited thereto. The via protective layer 172 may include a material having lower hardness than that of the via passivation layer 160. In an example embodiment, the via protective layer 172 may have lower strength than the upper passivation layer 164, and may include a polymer. In a horizontal cross-sectional view, the width W1 of the top surface of the via protective layer 172 may be 10 μm or less. The depth D from the top surface of the via protective layer 172 to the lower end thereof may be 0.3 μm or less.

The conductive pad 184 may be disposed on the through-electrode 130. The semiconductor device 100 may further include a conductive layer 180 disposed on the bottom surface of the conductive pad 184. Side surfaces of the conductive pad 184 and the conductive layer 180 may be aligned with one another, such that the conductive pad 184 and the conductive layer 180 have the same width in a horizontal cross-section. The conductive pad 184 may be electrically connected to the external connection terminal 152 via the through-electrode 130 and the wiring structure 140. In an example embodiment, the outer diameter of the via protective layer 172 may be smaller than the width of the conductive pad 184. For example, the conductive pad 184 may cover the via protective layer 172, without being limited thereto.

FIGS. 3-6 are vertical cross-sectional views of semiconductor devices according to example embodiments of the inventive concepts. A detailed description of components that are the same as or similar to those of the semiconductor device illustrated in FIGS. 1 and 2 may be omitted.

Figure 3:
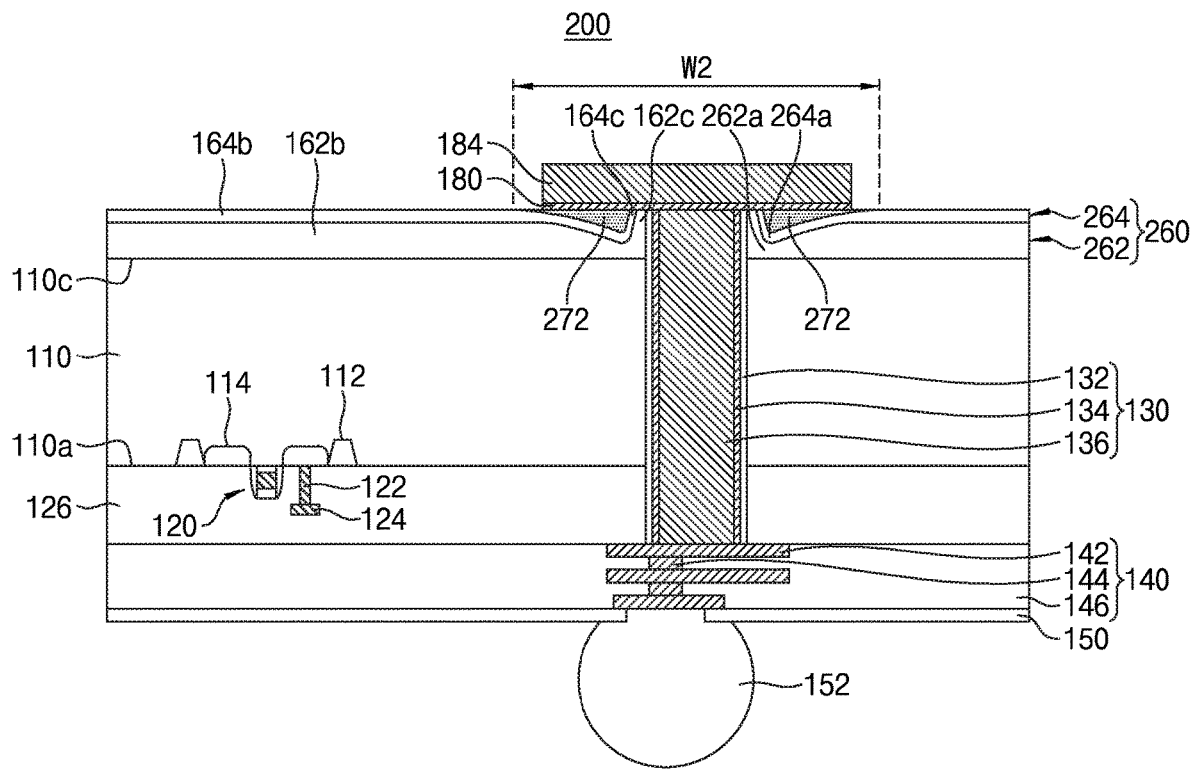
FIGS. 3-6 are vertical cross-sectional views of semiconductor devices, according to example embodiments of the inventive concepts.

Referring to FIG. 3, a semiconductor device 200 may include a via protective layer 272 disposed on the top surface of a via passivation layer 260 and surrounding a through-electrode 130. The via passivation layer 260 may include a lower passivation layer 262 and an upper passivation layer 264. The lower passivation layer 262 may include a lower concave portion 262a formed in the top surface thereof, a lower horizontal portion 162b extending in a horizontal direction, and a lower vertical portion 162c that is in contact with the through-electrode 130. The upper passivation layer 264 may include an upper concave portion 264a formed in the top surface thereof, an upper horizontal portion 164b extending in a horizontal direction, and an upper vertical portion 164c that is in contact with the lower vertical portion 162c. In an example embodiment, the lower concave portion 262a and the upper concave portion 264a in the semiconductor device 200 may be formed to be deeper than the lower concave portion 162a and the upper concave portion 164a in the semiconductor device 100. The outer diameter W2 of the via protective layer 272 may be larger than the horizontal width of the conductive pad 184. For example, a portion of the via protective layer 272 may not be covered by the conductive pad 184.

Figure 4:
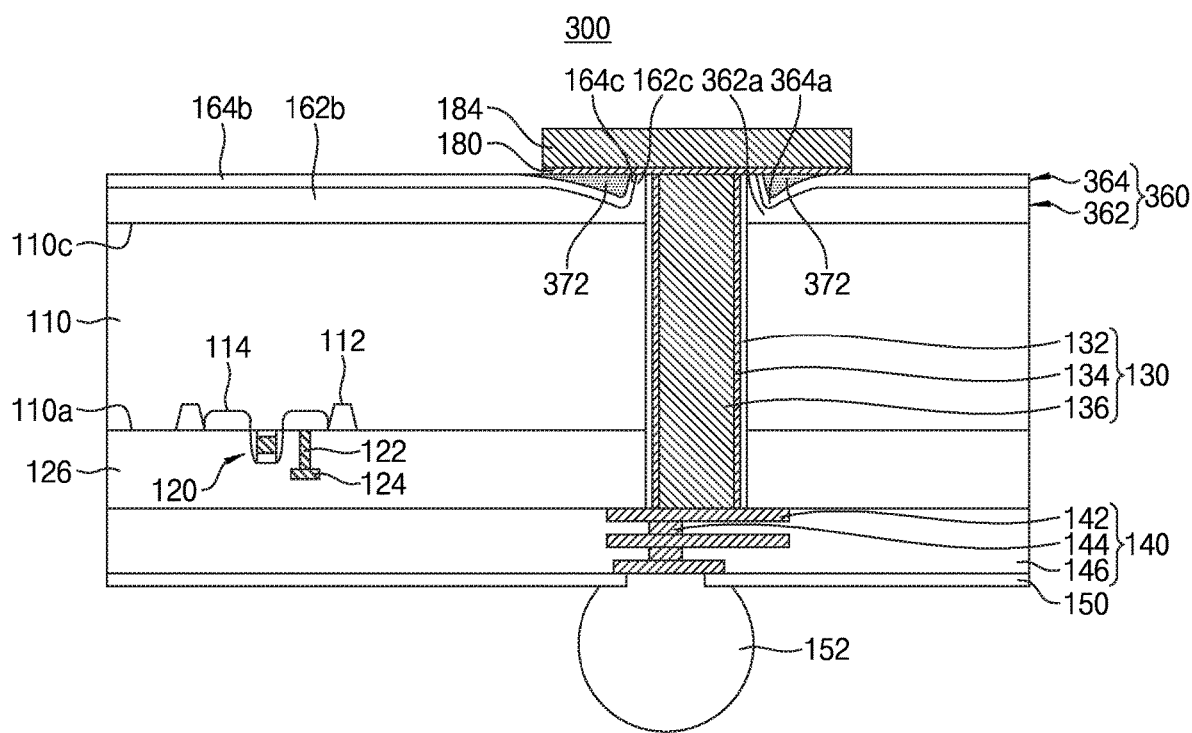

Referring to FIG. 4, a semiconductor device 300 may include a via protective layer 372 disposed on the top surface of a via passivation layer 360 and surrounding a through-electrode 130. The via passivation layer 360 may include a lower passivation layer 362 and an upper passivation layer 364. The lower passivation layer 362 may include a lower concave portion 362a formed in the top surface thereof, a lower horizontal portion 162b extending in a horizontal direction, and a lower vertical portion 162c that is in contact with the through-electrode 130. The upper passivation layer 364 may include an upper concave portion 364a formed in the top surface thereof, an upper horizontal portion 164b extending in a horizontal direction, and an upper vertical portion 164c that is in contact with the lower vertical portion 162c. In an example embodiment, in a vertical cross-sectional view, the depths of the lower concave portion 362a and the upper concave portion 364a may not be uniform. For example, the portions of the lower concave portion 362a and the upper concave portion 364a that are positioned on the left of the through-electrode 130 may be formed to be deeper than the portions of the lower concave portion 362a and the upper concave portion 364a that are positioned on the right of the through-electrode 130. In a vertical cross-sectional view, the size of the via protective layer 372 may not be uniform. For example, the portion of the via protective layer 372 that is positioned on the left of the through-electrode 130 may be formed to be deeper and wider than the portion of the via protective layer 372 that is positioned on the right of the through-electrode 130.

Figure 5:
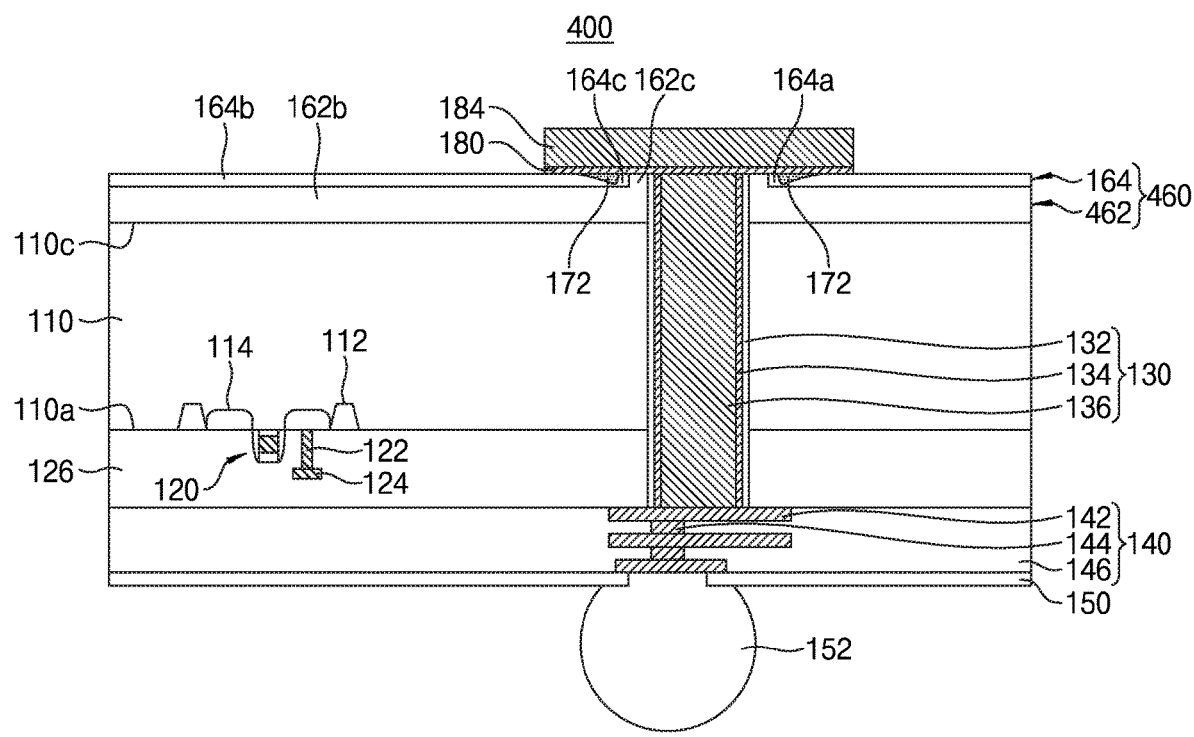

Referring to FIG. 5, a semiconductor device 400 may include a via protective layer 172 disposed on the top surface of a via passivation layer 460 and surrounding a through-electrode 130. The via passivation layer 460 may include a lower passivation layer 462 and an upper passivation layer 164, which surround a through-electrode 130. In an example embodiment, the lower passivation layer 462 may be conformally disposed along the inactive surface 110c of the substrate 110 and the side surface of the through-electrode 130, and the upper passivation layer 164 may not be conformally disposed. The corner of the lower passivation layer 462 between a lower horizontal portion 162b and a lower vertical portion 162c may form a substantially right angle.

Figure 6:
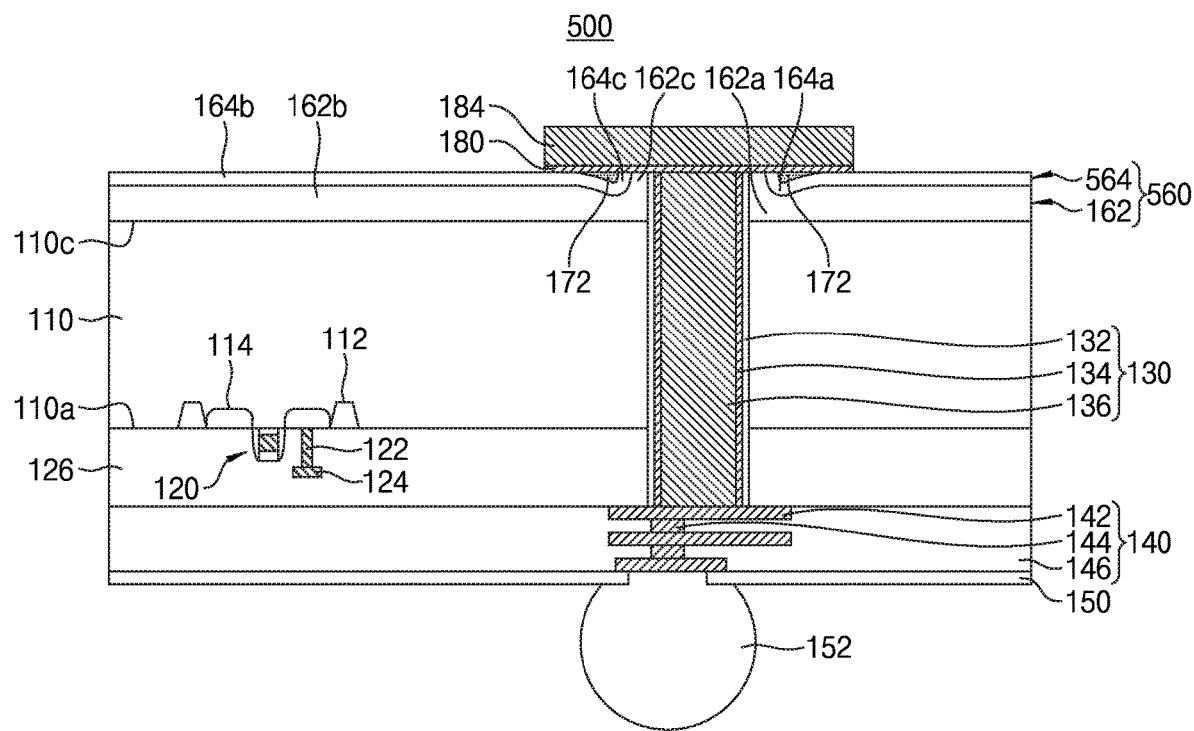

Referring to FIG. 6, a semiconductor device 500 may include a via protective layer 172 disposed on the top surface of a via passivation layer 560 and surrounding a through-electrode 130. The via passivation layer 560 may include a lower passivation layer 162 and an upper passivation layer 564, which surround a through-electrode 130. In an example embodiment, the lower passivation layer 162 may not be conformally disposed, and the upper passivation layer 564 may be conformally disposed on the lower passivation layer 162.

Figure 7:
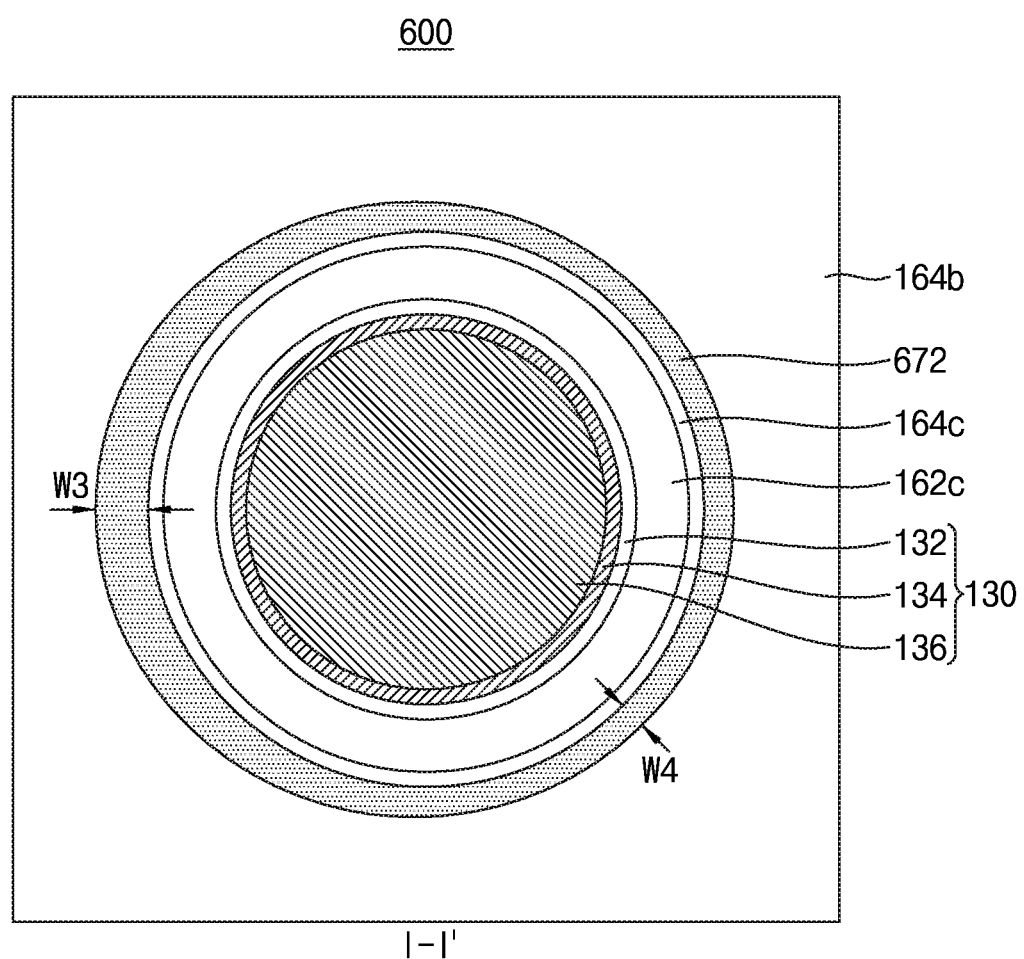
FIGS. 7-8 are horizontal cross-sectional views of semiconductor devices, according to example embodiments of the inventive concepts.
Figure 8:
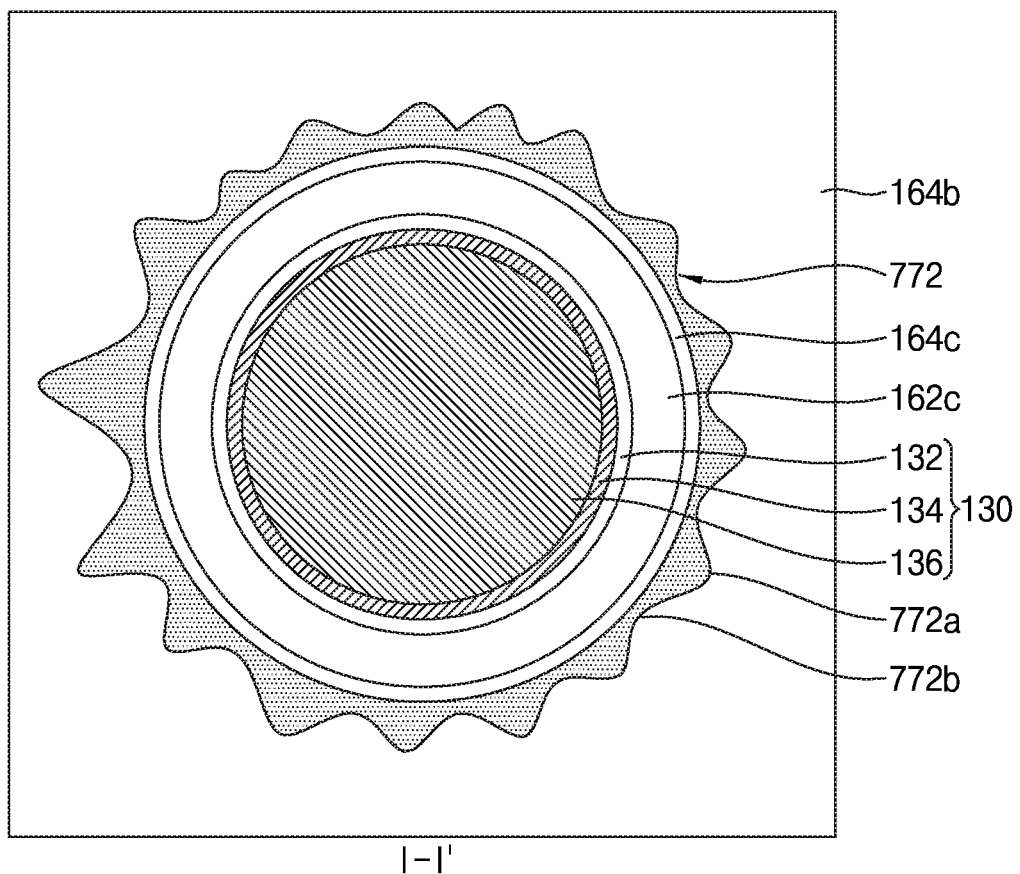

FIGS. 7-8 are horizontal cross-sectional views of semiconductor devices according to example embodiments of the inventive concepts.

Referring to FIG. 7, a semiconductor device 600 may include a via protective layer 672 disposed between an upper vertical portion 164*c* and an upper horizontal portion 164*b* and surrounding the upper vertical portion 164*c*. In an example embodiment, the horizontal width of the via protective layer 672 may not be uniform. For example, the via protective layer 672 may have an asymmetric ring shape, and may have a first width W3 and a second width W4. The second width W4 may be larger than the first width W3.

Referring to FIG. 8, a semiconductor device 700 may include a via protective layer 772 disposed between an upper vertical portion 164*c* and an upper horizontal portion 164*b* and surrounding the upper vertical portion 164*c*. In a horizontal cross-sectional view, the via protective layer 772 may have an irregular shape. For example, the via protective layer 772 may include a plurality of protruding portions 772*a* and a plurality of depressed portions 772*b*.

Figure 9:
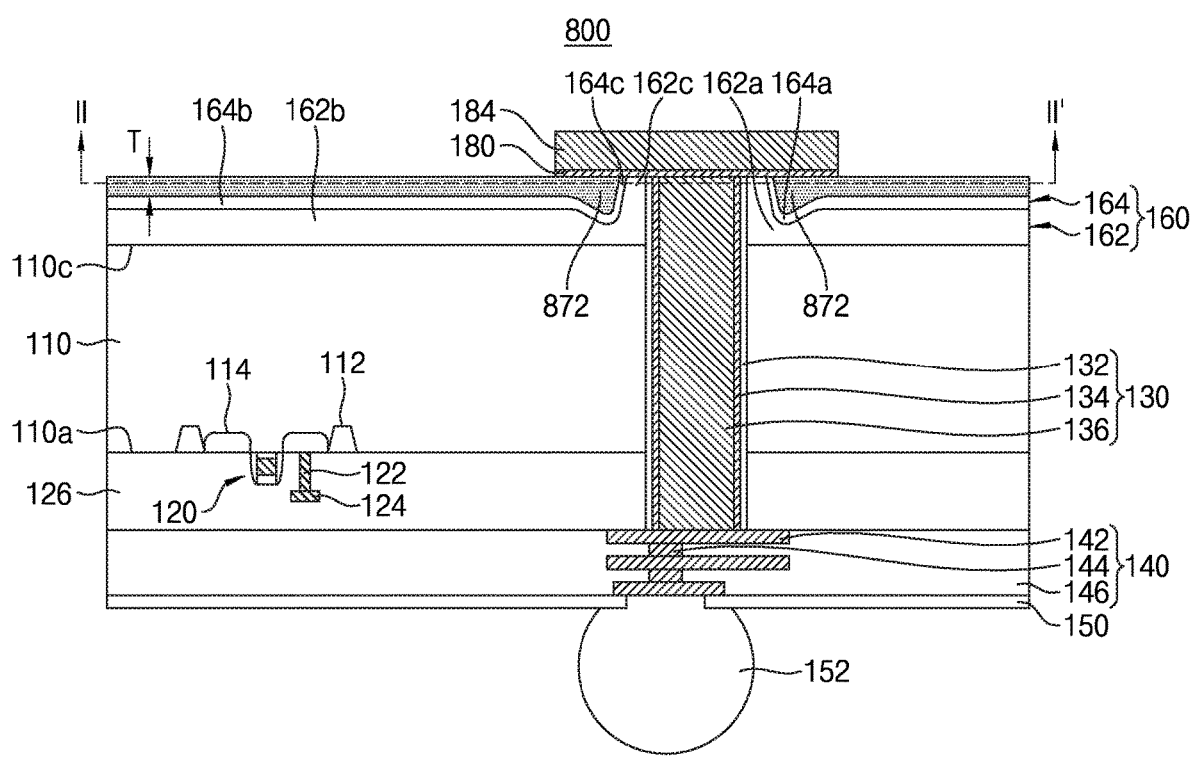
FIG. 9 is a vertical cross-sectional view of a semiconductor device, according to an example embodiment of the inventive concepts.
Figure 10:
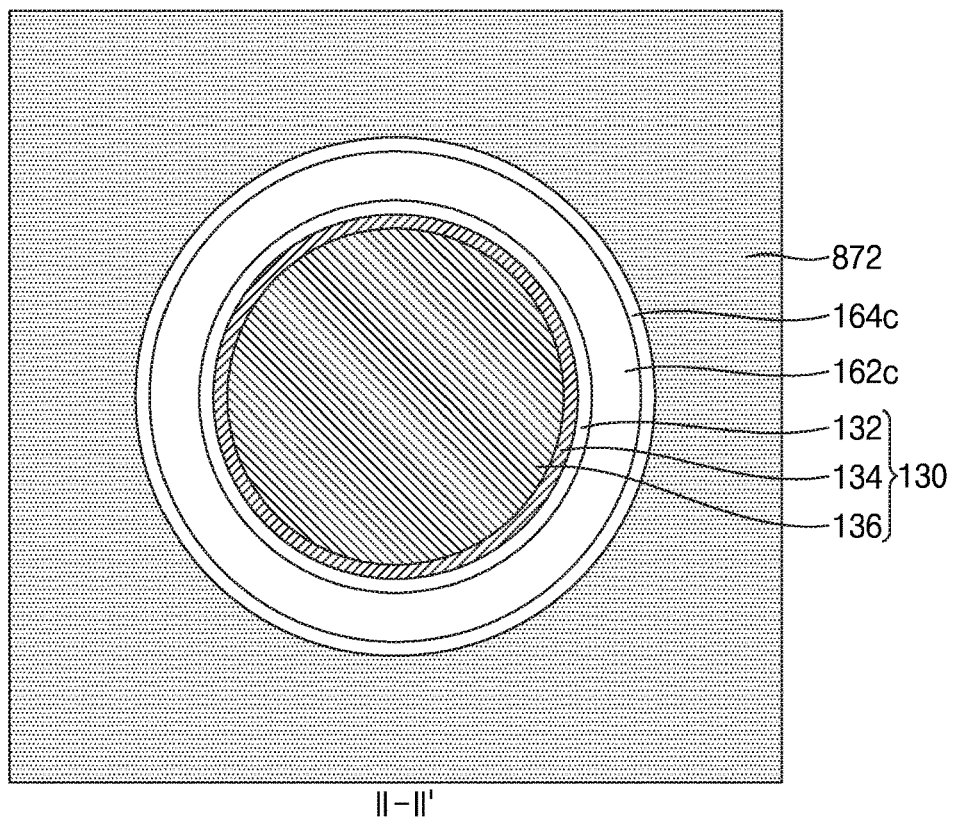
FIG. 10 is a horizontal cross-sectional view of the semiconductor device shown in FIG. 9, taken along line II-II'.

FIG. 9 is a vertical cross-sectional view of a semiconductor device according to an example embodiment of the inventive concepts. FIG. 10 is a horizontal cross-sectional view of the semiconductor device shown in FIG. 9, taken along line II-II'.

Referring to FIGS. 9 and 10, a semiconductor device 800 may include a via protective layer 872 disposed on a via passivation layer 160. In an example embodiment, the via protective layer 872 may extend in a horizontal direction, and an upper horizontal portion 164*b* of an upper passivation layer 164 may not be exposed. The top surfaces of a through-electrode 130, a lower vertical portion 162*c*, an upper vertical portion 164*c*, and the via protective layer 872 may be coplanar with each other. The thickness T of the via protective layer 872 on the upper horizontal portion 164*b* may be 2 μm or less.

FIGS. 11-22 are vertical cross-sectional views illustrating in process order of a method of manufacturing a semiconductor device according to an example embodiment of the inventive concepts.

Figure 11:
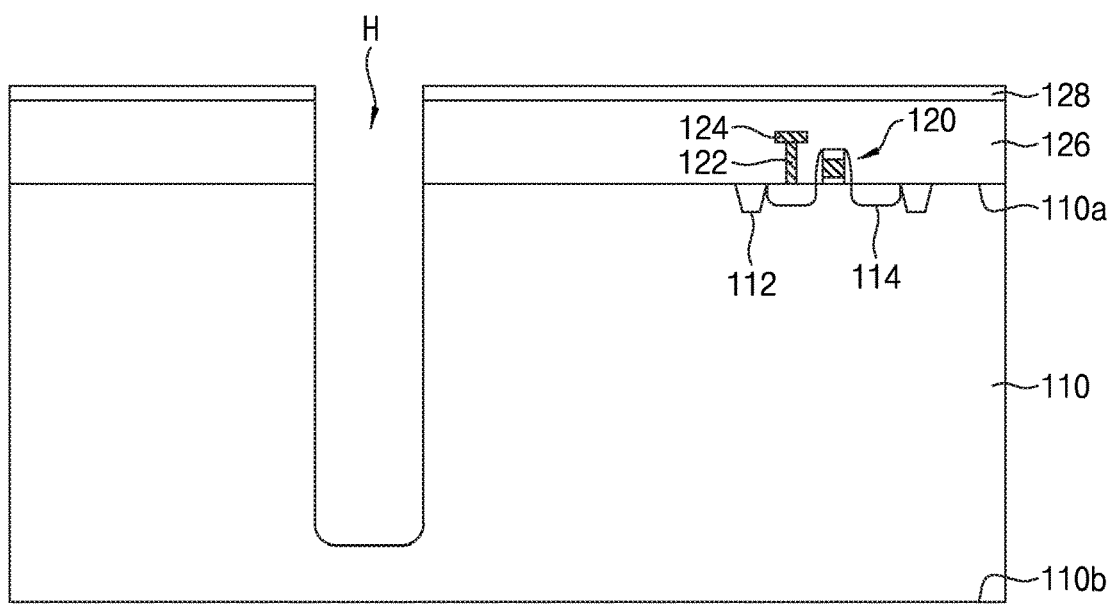
FIGS. 11-22 are vertical cross-sectional views illustrating in process order of a method of manufacturing a semiconductor device, according to an example embodiment of the inventive concepts.

Referring to FIG. 11, a method of manufacturing a semiconductor device 100 may include forming a device isolation layer 112, an impurity region 114, a transistor 120, a contact plug 122, an internal line 124, an interlayer insulating layer 126, and an etch stop layer 128 on a substrate 110 and forming a through-hole H in the substrate 110 and the interlayer insulating layer 126.

The substrate 110 may include an active surface 110*a* and an inactive surface 110*b*, which is the surface formed opposite the active surface 110*a*. The device isolation layer 112 and the impurity region 114 may be formed on the active surface 110*a* of the substrate 110. The substrate 110 may include a semiconductor material. In an example embodiment, the substrate 110 may include silicon. In an example embodiment, the device isolation layer 112 may include an insulating layer made of, for example, silicon oxide or silicon nitride. The impurity region 114 may include an n-type impurity or a p-type impurity.

The transistor 120 may be disposed on the active surface 110*a* of the substrate 110 so as to be adjacent to the impurity region 114. The contact plug 122 may be formed on the impurity region 114, and the internal line 124 may be formed on the contact plug 122. The interlayer insulating layer 126 may be formed so as to cover the transistor 120, the contact plug 122, and the internal line 124. In an example embodiment, the contact plug 122 and the internal line 124 may include metal, metal nitride, metal silicide, metal oxide, conductive carbon, polysilicon, or combinations thereof. The interlayer insulating layer 126 may include silicon oxide, silicon nitride, silicon oxynitride, or combinations thereof.

The etch stop layer 128 may be formed on the interlayer insulating layer 126, and the through-hole H may penetrate the interlayer insulating layer 126 and may be formed to a predetermined depth in the substrate 110. The forming the through-hole H may include performing a reactive ion etching (RIE) process or a laser drilling process.

Figure 12:
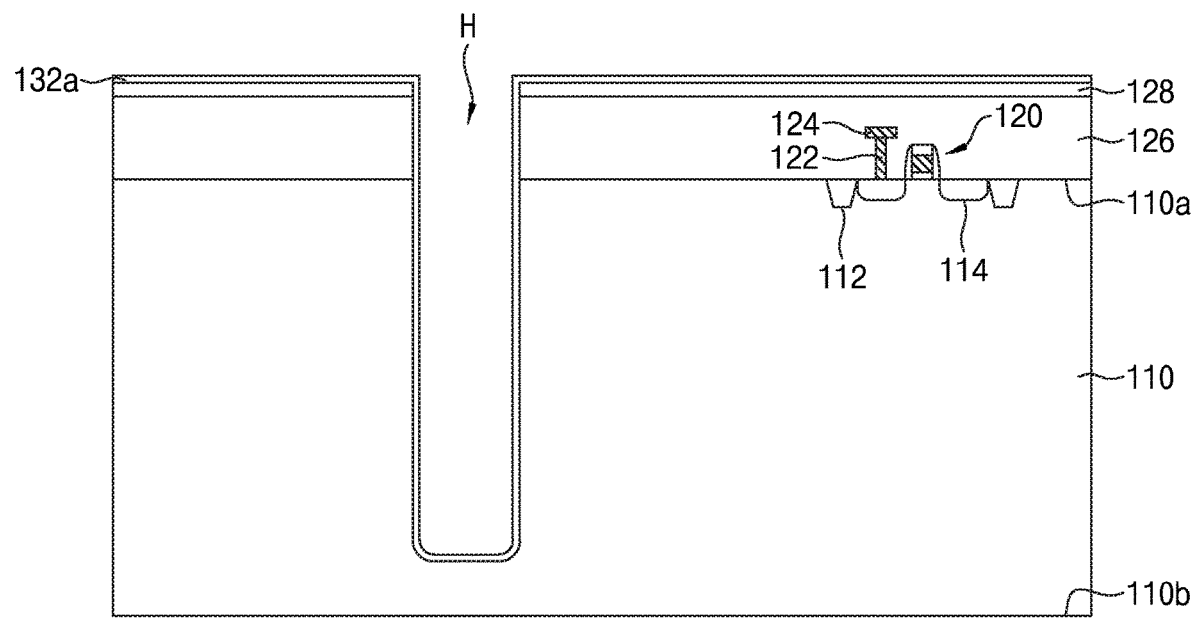

Referring to FIG. 12, the method may include forming a via insulating material 132*a*. The via insulating material 132*a* may be formed along the top surface of the etch stop layer 128 and the inner wall of the through-hole H. The via insulating material 132*a* may include silicon oxide, silicon nitride, a polymer, or combinations thereof. In an example embodiment, the via insulating material 132*a* may be formed through a chemical vapor deposition (CVD) process, and may include silicon oxide.

Figure 13:
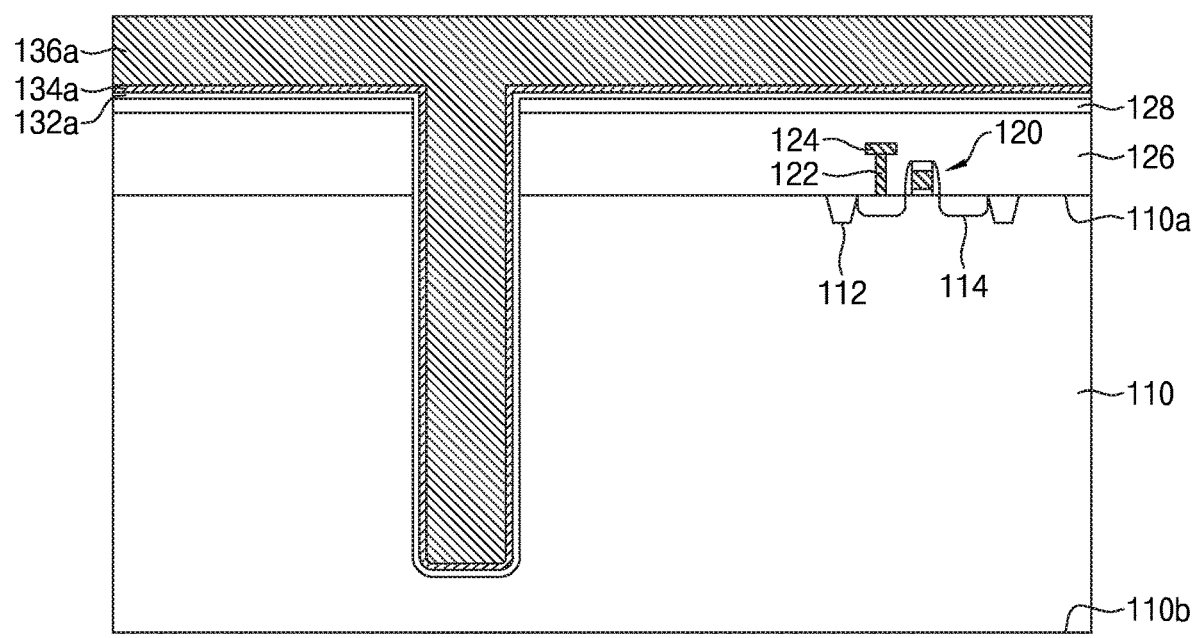

Referring to FIG. 13, the method may include forming a via barrier material 134*a* and a conductive material 136*a*. The via barrier material 134*a* may be formed on the via insulating material 132*a*. The via barrier material 134*a* may be formed in a single-layered or multi-layered structure including at least one of W, WN, Ti, TiN, Ta, TaN, or Ru. In an example embodiment, the via barrier material 134*a* may be conformally formed through a physical vapor deposition (PVD) process, a CVD process, or an atomic layer deposition (ALD) process. The conductive material 136*a* may be formed on the via barrier material 134*a*. The forming the conductive material 136*a* may include performing a plating process. For example, a seed layer (not illustrated) may be formed on the via barrier material 134*a* through a CVD process or a PVD process, and the via conductive material 136*a* may be formed through a plating process using the seed layer as a seed. In an example embodiment, the via conductive material 136*a* may include Cu, CuSn, CuMg, CuNi, CuZn, CuPd, CuAu, CuW, W, or a W alloy.

Figure 14:
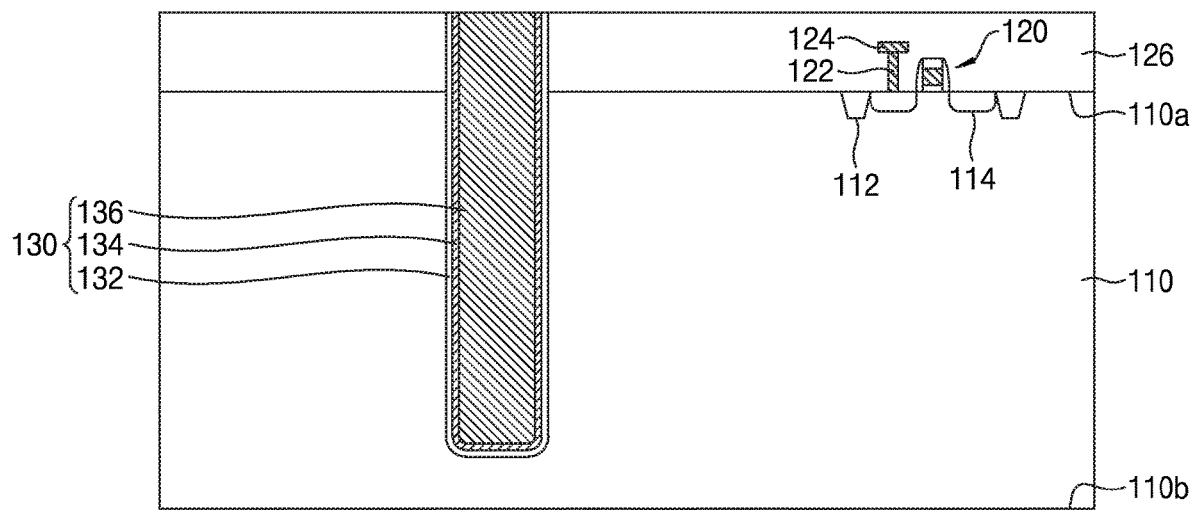

Referring to FIG. 14, the method may include performing a chemical-mechanical polishing (CMP) process. For example, an upper portion of the product of FIG. 11 may be removed through the CMP process. The etch stop layer may be removed, and the interlayer insulating layer 126 may be exposed. Portions of the via insulating material 132*a*, the via barrier material 134*a*, and the conductive material 136*a* may be removed, so that a via insulating layer 132, a via barrier layer 134, and a conductive via 136 remain. The via insulating layer 132, the via barrier layer 134, and the conductive via 136 may form a through-electrode 130.

Figure 15:
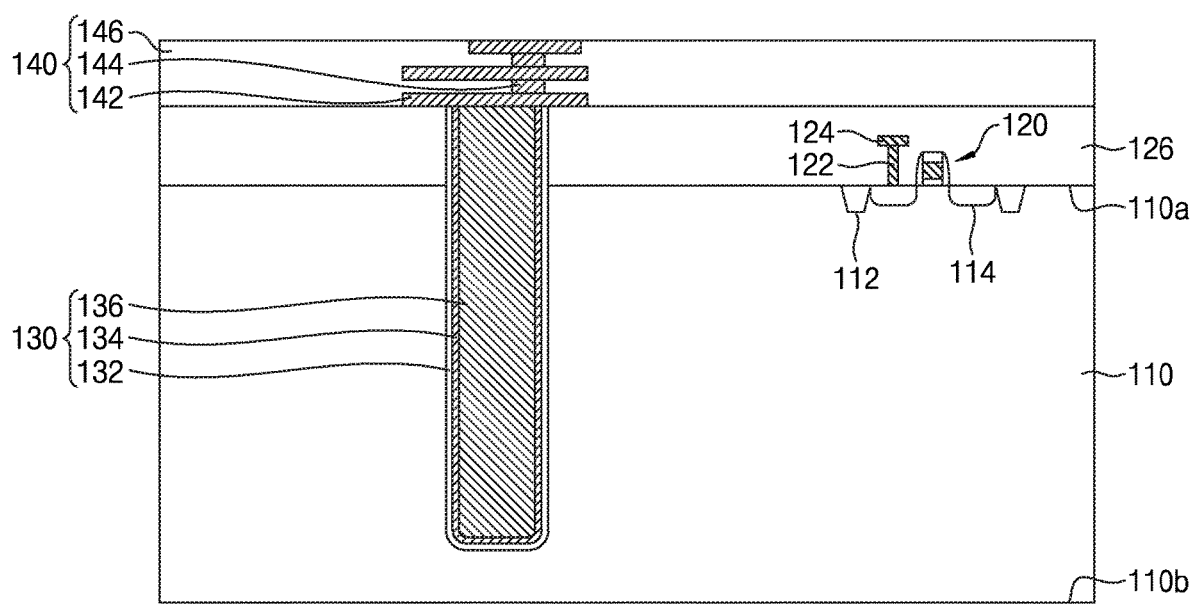

Referring to FIG. 15, the method may include forming a wiring structure 140 connected to the through-electrode 130. The wiring structure 140 may be formed on the interlayer insulating layer 126 and the through-electrode 130. The wiring structure 140 may be formed in a single-layered or multi-layered structure. For example, the wiring structure 140 may include wiring layers 142, contact plugs 144 connecting the wiring layers 142 to each other, and an interlayer insulating layer 146 covering the wiring layers 142 and the contact plug 144. In an example embodiment, the wiring layer 142 and the contact plug 144 may include Cu. The interlayer insulating layer 146 may include a low dielectric material such as silicon oxide or polymer.

Figure 16:
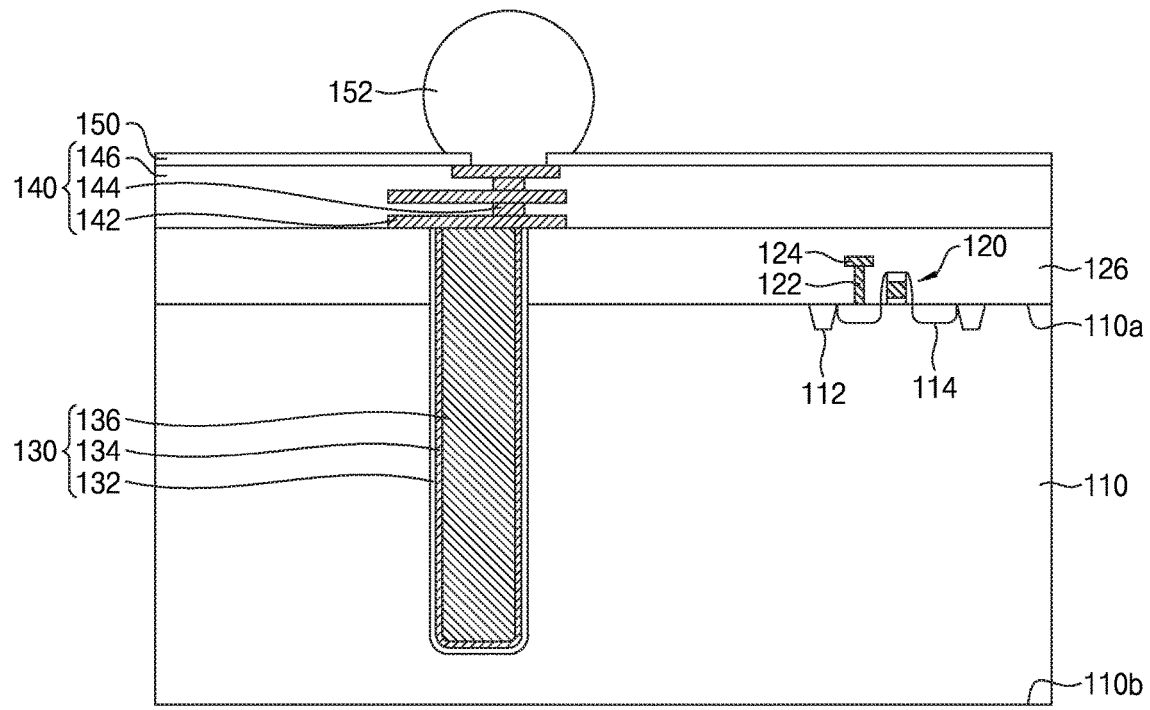

Referring to FIG. 16, the method may include forming an insulating layer 150 and an external connection terminal 152. The insulating layer 150 may be formed on the interlayer insulating layer 146, and may expose a portion of the wiring layer 142 of the wiring structure 140. The external connection terminal 152 may be formed on the insulating layer 150, and may be connected to the wiring layer 142. The external connection terminal 152 may be electrically connected to the through-electrode 130 via the wiring structure 140.

Figure 17:
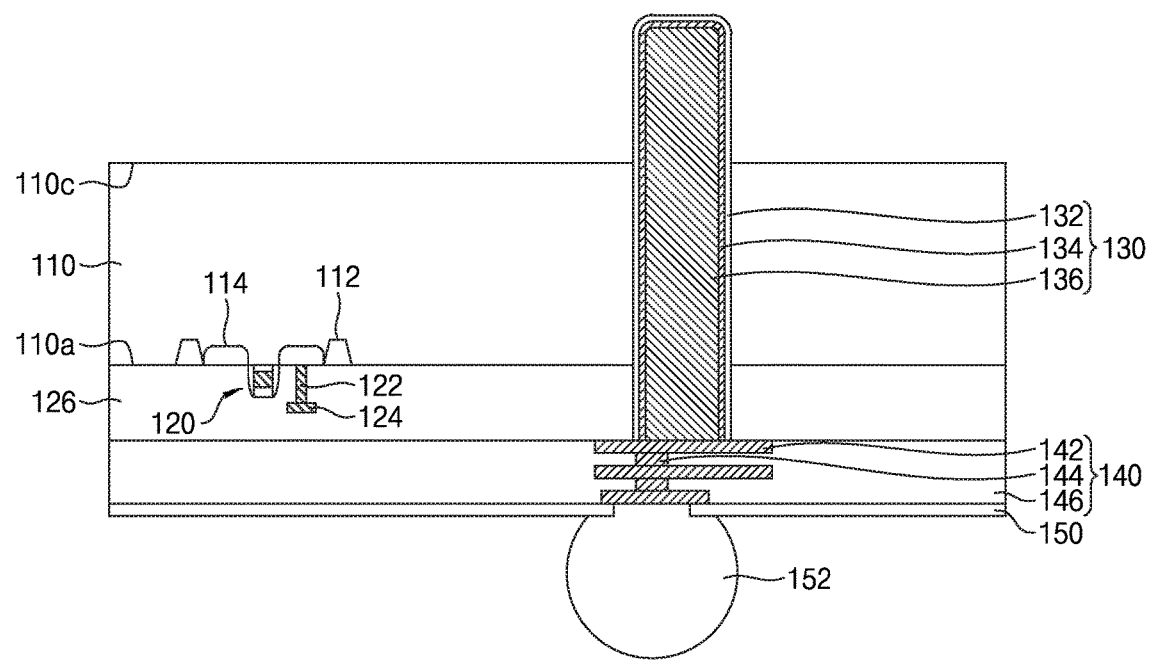

Referring to FIG. 17, the method may include etching the substrate 110 to expose the through-electrode 130. A carrier (not illustrated) may be attached to the insulating layer 150 and the external connection terminal 152, so that the inactive surface 110b of the substrate 110 is flipped so as to be oriented upwards. The inactive surface 110b may be etched to form an inactive surface 110c. The etching the substrate 110 may include a process of selectively etching silicon, and a CMP process and a grinding process may be further performed. A portion of the through-electrode 130 may be exposed above the inactive surface 110c of the substrate 110.

Figure 18:
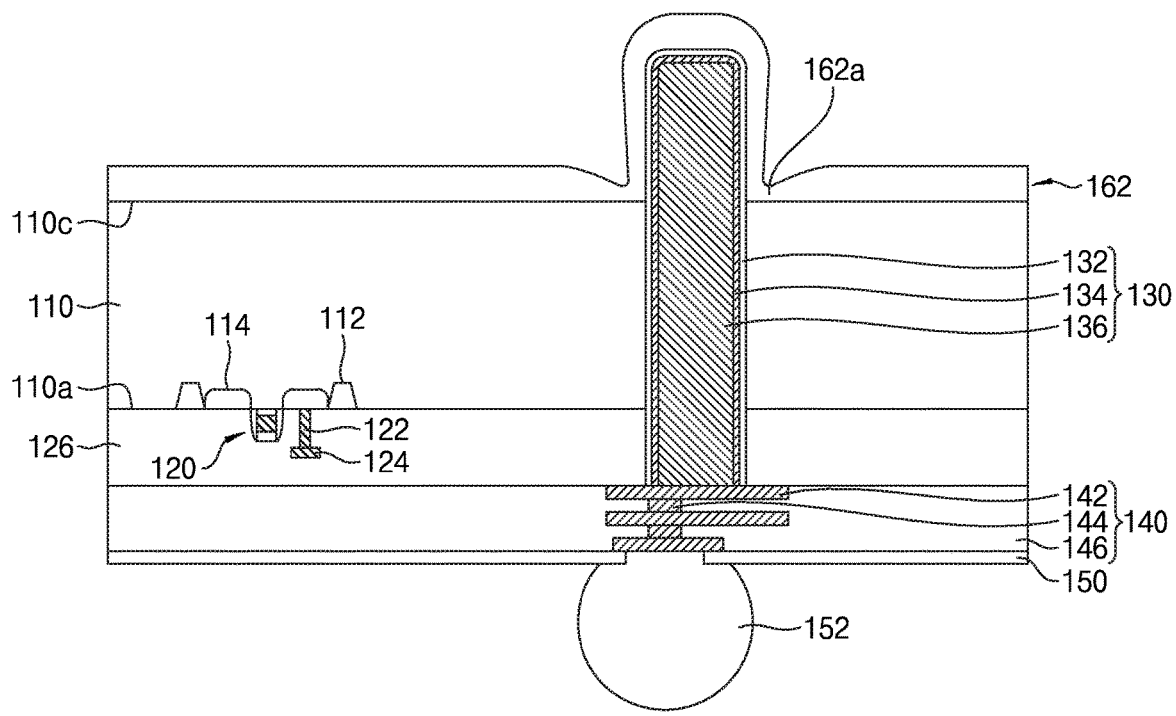

Referring to FIG. 18, the method may include forming a lower passivation layer 162 covering the inactive surface 110c and the through-electrode 130. The lower passivation layer 162 may be deposited through a CVD process. In an example embodiment, the lower passivation layer 162 may not be conformally formed. For example, the lower passivation layer 162 may not be sufficiently deposited on a portion at which the inactive surface 110c of the substrate 110 is in contact with the through-electrode 130. The top surface of the lower passivation layer 162 may include a lower concave portion 162a formed along the circumference of the through-electrode 130. The lower concave portion 162a may be formed in a region where the inactive surface 110c of the substrate 110 is in contact with the through-electrode 130. In an example embodiment, the first passivation layer may include silicon oxide. In another exemplary embodiment, the lower passivation layer 162 may be conformally deposited.

Figure 19:
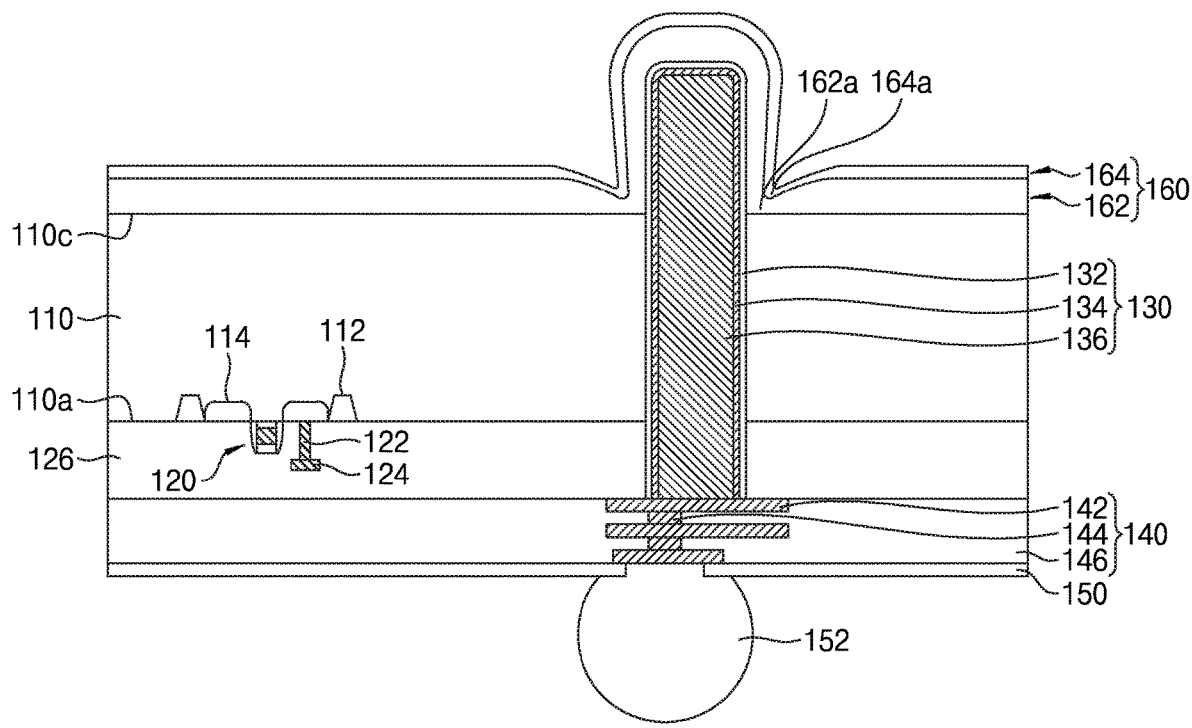

Referring to FIG. 19, the method may include forming an upper passivation layer 164 covering the lower passivation layer 162. The lower passivation layer 162 may be deposited through a CVD process. In an example embodiment, the upper passivation layer 164 may not be conformally formed. For example, the upper passivation layer 164 may not be sufficiently deposited on the lower concave portion 162a in the lower passivation layer 162. The top surface of the upper passivation layer 164 may include an upper concave portion 164a formed along the lower concave portion 162a. The lower passivation layer 162 and the upper passivation layer 164 may together constitute a via passivation layer 160. In an example embodiment, the upper passivation layer 164 may include silicon nitride. In another exemplary embodiment, the upper passivation layer 164 may be conformally deposited.

Figure 20:
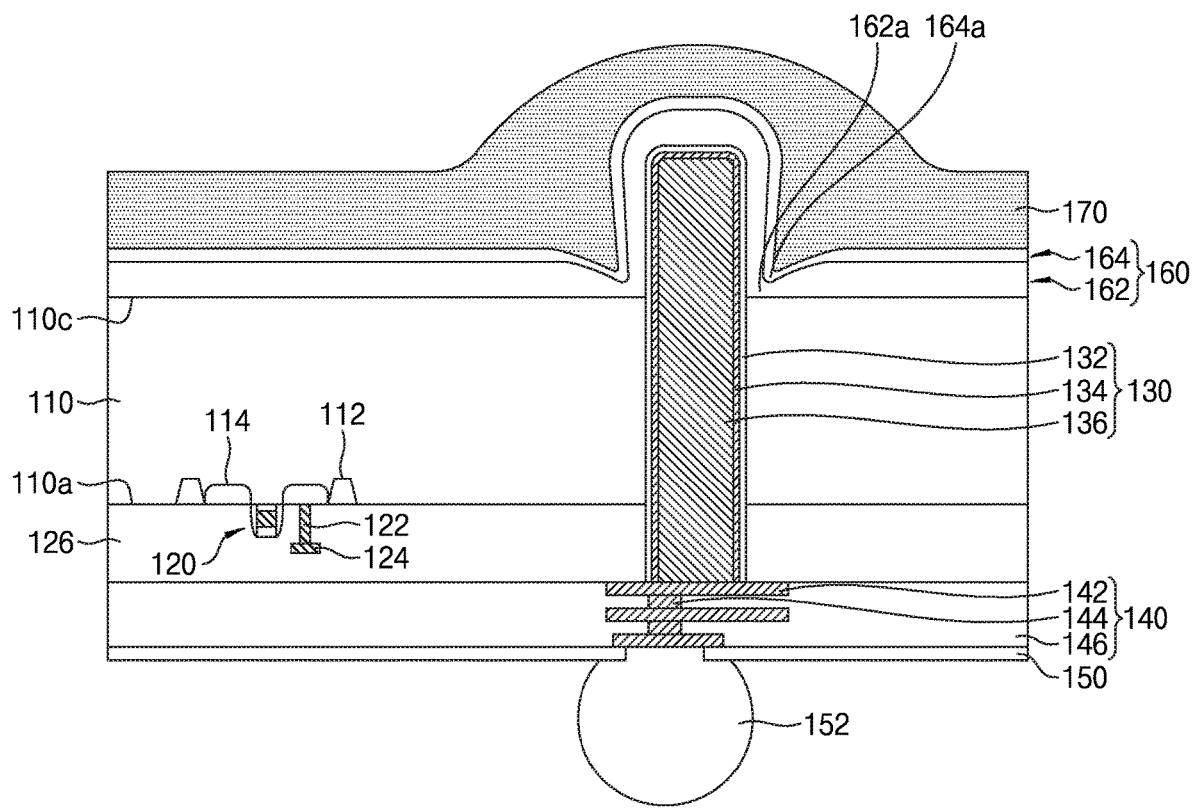

Referring to FIG. 20, the method may include forming a via protective material 170. The via protective material 170 may cover the upper passivation layer 164. The via protective material 170 may include a material having higher fluidity than the lower passivation layer 162 or the upper passivation layer 164. For example, the via protective material 170 may include a polymer such as polyimide, polyhydroxystyrene (PHST), polybenzoxazole (PBO), or polyamide. The via protective material 170 may include a material having lower strength than that of the via passivation layer 160. In an example embodiment, the via protective material 170 may include a material having lower strength than that of the upper passivation layer 164.

The method may further include curing the via protective material 170. The curing process may be performed at a temperature of 80° C. to 400° C., and the via protective material 170 may be cured through the curing process.

Figure 21:
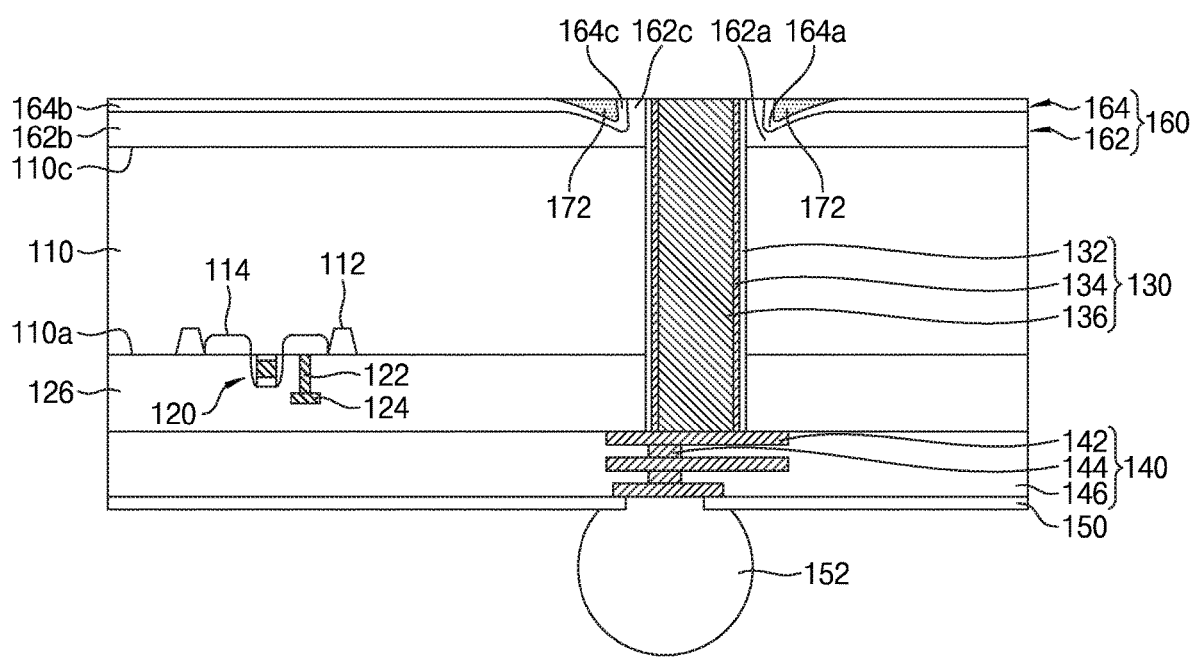

Referring to FIG. 21, the method may include performing a polishing process to expose the conductive via 136 and the via passivation layer 160. The lower passivation layer 162, the upper passivation layer 164, and the via protective material 170 may be flattened together with the through-electrode 130 through the polishing process. The via passivation layer 160 may be imparted with a bent shape through the polishing process. For example, the lower passivation layer 162 may include a lower concave portion 162a, a lower horizontal portion 162b extending in a horizontal direction, and a lower vertical portion 162c extending in a vertical direction. The lower concave portion 162a may be disposed between the lower horizontal portion 162b and the lower vertical portion 162c. The upper passivation layer 164 may include an upper concave portion 164a, an upper horizontal portion 164b extending in a horizontal direction, and an upper vertical portion 164c extending in a vertical direction. The upper concave portion 164a may be disposed between the upper horizontal portion 164b and the upper vertical portion 164c.

The via protective material 170 may be flattened, so that a via protective layer 172 remains between a first top surface of the upper passivation layer 164 and the horizontal portion thereof. Referring further to FIG. 2, in a plan view, the lower vertical portion 162c of the lower passivation layer 162 may surround the through-electrode 130. The upper vertical portion 164c of the upper passivation layer 164 may surround the lower vertical portion 162c of the lower passivation layer 162, and the via protective layer 172 may surround the upper vertical portion 164c of the upper passivation layer 164. The upper horizontal portion 164b of the upper passivation layer 164 may surround the via protective layer 172. The top surfaces of the through-electrode 130, the lower vertical portion 162c, the upper vertical portion 164c, the via protective layer 172, and the upper horizontal portion 164b may be coplanar with each other.

As illustrated in FIGS. 18 and 19, the aspect ratio of the surface to be etched through the CMP process may be lowered by covering the via passivation layer 160 with the via protective material 170. Therefore, it is possible to prevent or minimize the generation of frictional force during the polishing process. In addition, it is possible to prevent or minimize breakage of the through-electrode 130.

Figure 22:
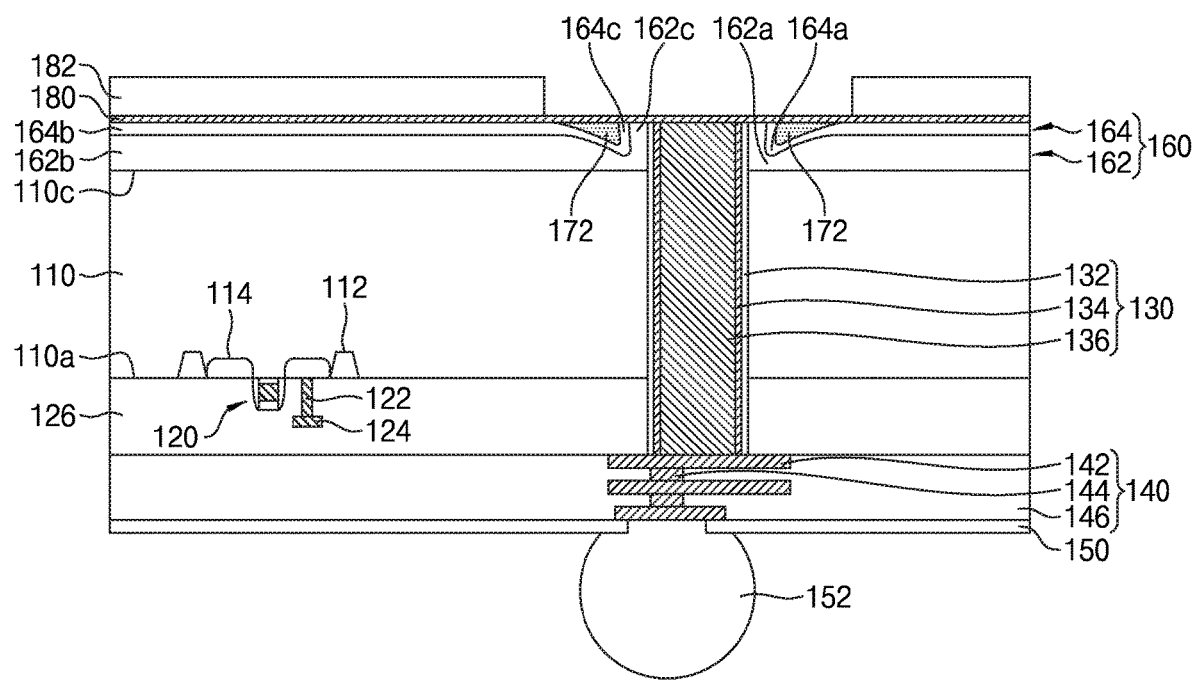

Referring to FIG. 22, the method may include forming a conductive layer 180 and a mask pattern 182. The conductive layer 180 may be deposited on the product of FIG. 21. For example, the conductive layer 180 may contact the top surfaces of the through-electrode 130, the lower vertical portion 162c, the upper vertical portion 164c, the via protective layer 172, and the upper horizontal portion 164b. The conductive layer 180 may function as an under-bump metal, and may include Cr/Cr—Cu/Cu, Ti—W/Cu, Al/Ni/Cu, or nickel. The mask pattern 182 may be formed on the conductive layer 180, and may expose a portion of the conductive layer 180 that corresponds to the through-electrode 130. The mask pattern 182 may include a photoresist.

Referring back to FIG. 1, the method may include forming a conductive pad 184. The forming the conductive pad 184 may include performing a plating process. In an example embodiment, the conductive pad 184 may include Ni, Au, Cu, Al, or combinations thereof. The method may include removing the mask pattern 182 and selectively removing the conductive layer 180. The mask pattern 182 may be removed after the conductive pad 184 is formed. A portion of the conductive layer 180 that is not covered by the conductive pad 184 may be selectively removed to expose the via passivation layer 160.

Figure 23:
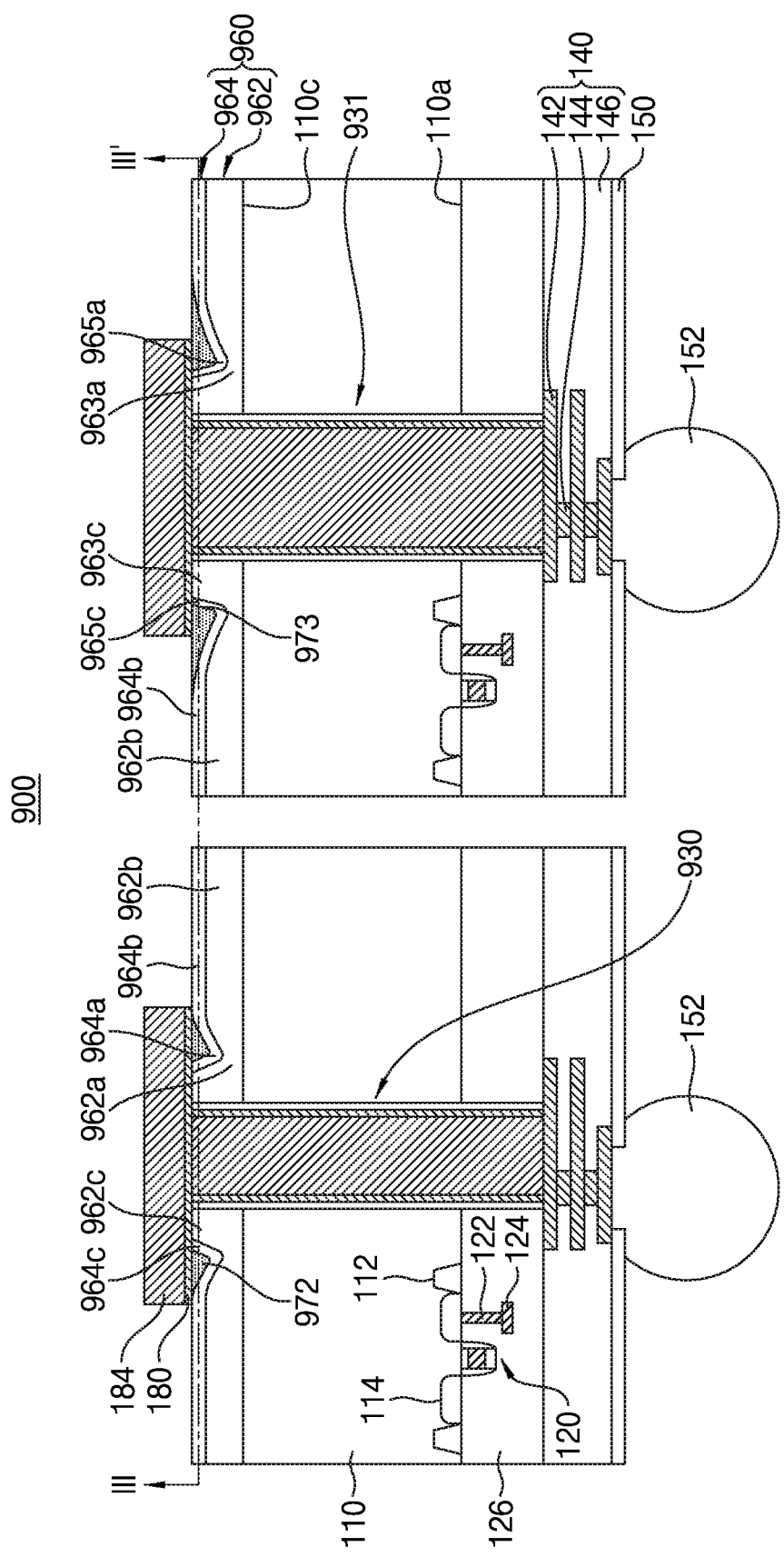
FIG. 23 is a vertical cross-sectional view of a semiconductor device, according to an example embodiment of the inventive concepts.
Figure 24:
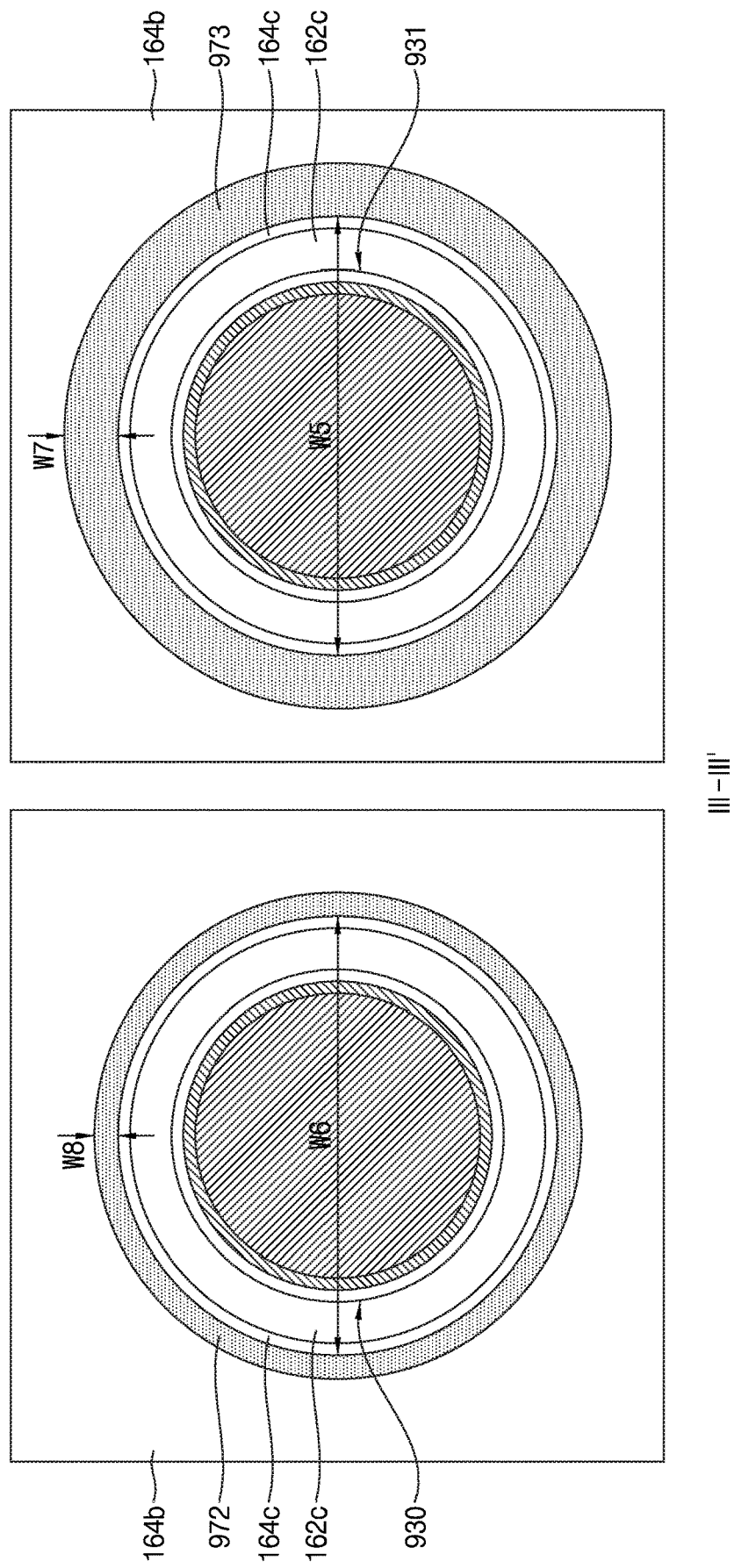
FIG. 24 is a horizontal cross-sectional view of the semiconductor device shown in FIG. 23, taken along line II-II'.

FIG. 23 is a vertical cross-sectional view of a semiconductor device, according to an example embodiment of the inventive concepts. FIG. 24 is a horizontal cross-sectional view of the semiconductor device shown in FIG. 23, taken along line II-II'.

Referring to FIGS. 23 and 24, a semiconductor device 900 may include a first through-electrode 930, a second through-electrode 931, a via passivation layer 960, a first via protective layer 972, and a second via protective layer 973. In an example embodiment, the semiconductor device 900 may include through-electrodes 130 having different respective sizes and vertically penetrating a substrate 110, an interlayer insulating layer 126, and the via passivation layer 960. The through-electrodes 130 of the semiconductor device 900 may be the first through-electrode 930 and the second through-electrode 931. For example, the horizontal width of the second through-electrode 931 may be larger than the horizontal width of the first through-electrode 930. The horizontal width of the first through-electrode 930 and the horizontal width of the second through-electrode 931 may range from 1.0 µm to 12.0 µm.

The via passivation layer 960 may be disposed on the inactive surface 110c of the substrate 110, and may include a lower passivation layer 962 and an upper passivation layer 964 disposed on the lower passivation layer 962. The lower passivation layer 962 may include a first lower concave portion 962a, a lower horizontal portion 962b, a first lower vertical portion 962c, a second lower concave portion 963a, and a second lower vertical portion 963c.

The lower horizontal portion 962b may extend in a horizontal direction on the inactive surface 110c of the substrate 110. The first lower concave portion 962a may be disposed adjacent to the first through-electrode 930. For example, the first lower concave portion 962a may be formed in a corner between the lower horizontal portion 962b and the first lower vertical portion 962c. The first lower concave portion 962a may extend along the circumference of the first through-electrode 930, and may have a rounded cross-section. The second lower concave portion 963a may be disposed adjacent to the second through-electrode 931. For example, the second lower concave portion 963a may be formed in a corner between the lower horizontal portion 962b and the second lower vertical portion 963c. The second lower concave portion 963a may extend along the circumference of the second through-electrode 931, and may have a rounded cross-section. In a horizontal cross-sectional view, the first lower vertical portion 962c may surround the first through-electrode 930, and the second lower vertical portion 963c may surround the second through-electrode 931.

The upper passivation layer 964 may include a first upper concave portion 964a, an upper horizontal portion 964b, a first upper vertical portion 964c, a second upper concave portion 965a, and a second upper vertical portion 965c.

The upper horizontal portion 964b may extend in a horizontal direction on the lower horizontal portion 962b. The first upper concave portion 964a may be formed in a corner between the upper horizontal portion 964b and the first upper vertical portion 964c. The first upper concave portion 964a may extend along the circumference of the first lower vertical portion 962c, and may have a rounded cross-section. The second upper concave portion 965a may be formed in a corner between the upper horizontal portion 964b and the second upper vertical portion 965c. The second upper concave portion 965a may extend along the circumference of the second lower vertical portion 963c, and may have a rounded cross-section. In a horizontal cross-sectional view, the first upper vertical portion 964c may surround the first lower vertical portion 962c, and the second upper vertical portion 965c may surround the second lower vertical portion 963c. In this specification, the first lower concave portion 962a and the first upper concave portion 964a may be collectively referred to as a first concave portion, and the second lower concave portion 963a and the second upper concave portion 965a may be collectively referred to as a second concave portion.

The first via protective layer 972 may be disposed on the top surface of the via passivation layer 960. For example, the first via protective layer 972 may fill the first upper concave portion 964a. The first via protective layer 972 may be coplanar with the first through-electrode 930 and the via passivation layer 960. In a horizontal cross-sectional view, the first via protective layer 972 may surround the first upper vertical portion 964c.

The second via protective layer 973 may be disposed on the top surface of the via passivation layer 960. For example, the second via protective layer 973 may fill the second upper concave portion 965a. The second via protective layer 973 may be coplanar with the second through-electrode 931 and the via passivation layer 960. In a horizontal cross-sectional view, the second via protective layer 973 may surround the second upper vertical portion 965c. In an example embodiment, the inner diameter W5 of the second via protective layer 973 may be larger than the inner diameter W6 of the first via protective layer 972. In a horizontal cross-sectional view, the width W7 of the second via protective layer 973 may be larger than the width W8 of the first via protective layer 972. The second via protective layer 973 may be formed to be deeper than the first via protective layer 972. For example, the depth from the top surface of the second via protective layer 973 to the lower end thereof may be larger than the depth from the top surface of the first via protective layer 972 to the lower end thereof.

The conductive pads 184 connected to the first through-electrode 930 and the second through-electrode 931 may have substantially the same size.

Figure 25:
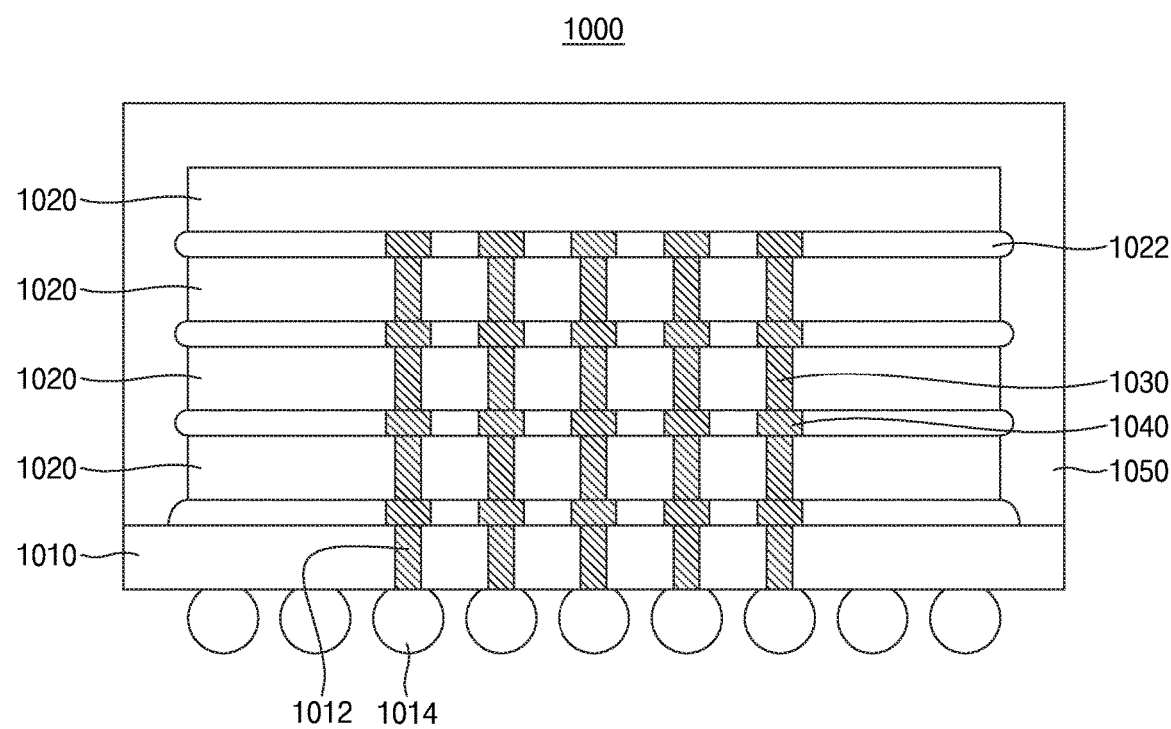
FIGS. 25-26 are vertical cross-sectional views of semiconductor packages, according to example embodiments of the inventive concepts.
Figure 26:
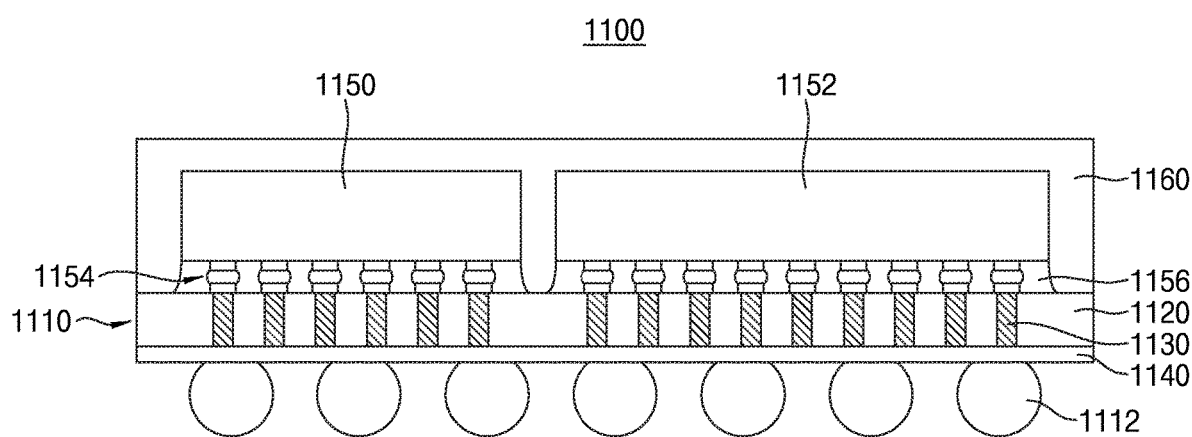

FIGS. 25-26 are vertical cross-sectional views of semiconductor packages, according to example embodiments of the inventive concepts.

Referring to FIG. 25, a semiconductor package 1000 may include a first semiconductor chip 1010, second semiconductor chips 1020, adhesive layers 1022, through-electrodes 1030, connection members 1040, and an encapsulation material 1050. For example, the semiconductor package 1000 may include a plurality of second semiconductor chips 1020 vertically stacked on the first semiconductor chip 1010. The first semiconductor chip 1010 may include through-electrodes 1012 formed therein and external connection terminals 1014 formed on the bottom surface thereof. The through-electrodes 1012 may be electrically connected to the external connection terminals 1014.

The plurality of second semiconductor chips 1020 may be stacked in a stack structure. Although the number of second semiconductor chips 1020 is illustrated as being three, the disclosure is not limited thereto. The space between the second semiconductor chips 1020 and the space between the first semiconductor chip 1010 and the second semiconductor chip 1020 may be filled with the adhesive layer 1022. The second semiconductor chip 1020 may include through-electrodes 1030 formed therein. The second semiconductor chips 1020 may be connected to each other via connection members 1040. For example, the connection members 1040 may be electrically connected to the through-electrodes 1030. The encapsulation material 1050 may cover the first semiconductor chip 1010 and the second semiconductor chips 1020. The encapsulation material 1050 may include an epoxy molding compound (EMC).

The first semiconductor chip 1010 and the second semiconductor chips 1020 may have configurations similar to that of the semiconductor device 100 illustrated in FIGS. 1 and 2. For example, the first semiconductor chip 1010 and the second semiconductor chip 1020 may include components that are respectively the same as or similar to the interlayer insulating layer 126, the through-electrode 130, the wiring structure 140, the via passivation layer 160, and the via protective layer 172.

In an example embodiment, the first semiconductor chip 1010 may include an application processor (AP) chip, such as a microprocessor or a microcontroller, or a logic chip, such as a CPU, a GPU, a modem, an application-specific IC (ASIC), or a field-programmable gate array (FPGA). The second semiconductor chip 1020 may include a memory chip such as DRAM, SRAM, PRAM, MRAM, or flash memory.

Referring to FIG. 26, a semiconductor package 1100 may include an interposer 1110, a first semiconductor chip 1150, a second semiconductor chip 1152, an adhesive layer 1156, connection member 1154, and an encapsulation material 1160. The interposer 1110 may include external connection terminals 1112, a substrate, through-electrodes 1130, and a device layer. The external connection terminals 1112 may be disposed on the bottom surface of the interposer 1110. The substrate may be a silicon substrate or a printed circuit board. In another exemplary embodiment, the substrate may include an insulating material such as polyimide or prepreg. The device layer may be disposed on the bottom surface of the substrate. The device layer may include, for example, a metal-oxide-semiconductor field effect transistor (MOSFET), a system large-scale integration (LSI) device, an image sensor, an active device, or a passive device.

The interposer 1110 may have a configuration similar to that of the semiconductor device 100 illustrated in FIGS. 1 and 2. For example, the interposer 1110 may include components that are respectively the same as or similar to the interlayer insulating layer 126, the through-electrode 130, the wiring structure 140, the via passivation layer 160, and the via protective layer 172.

The first semiconductor chip 1150 and the second semiconductor chip 1152 may be mounted on the interposer 1110. The first semiconductor chip 1150 may be electrically connected to the second semiconductor chip 1152 via the interposer 1110. The connection members 1154 may connect the first semiconductor chip 1150 and the second semiconductor chip 1152 to the interposer 1110. The space between each of the first semiconductor chip 1150 and the second semiconductor chip 1152 and the interposer 1110 may be filled with the adhesive layer 1156. The encapsulation material 1160 may cover the interposer 1110, the first semiconductor chip 1150, and the second semiconductor chip 1152. The encapsulation material 1160 may include an EMC.

As is apparent from the above description, according to the exemplary embodiments of the disclosure, it is possible to minimize or prevent breakage of a through-electrode.

While the embodiments of the disclosure have been described with reference to the accompanying drawings, it should be understood by those skilled in the art that various modifications may be made without departing from the scope of the disclosure and without changing essential features thereof. Therefore, the above-described embodiments should be considered in a descriptive sense only and not for the purposes of limitation.

What is claimed is:

1. A semiconductor device comprising:
   a via passivation layer disposed on an inactive surface of a substrate;
   a through-electrode vertically penetrating the substrate and the via passivation layer;
   a concave portion formed in a top surface of the via passivation layer, the concave portion being adjacent to the through-electrode; and
   a via protective layer horizontally overlapping the via passivation layer and the through-electrode and filling the concave portion,
   wherein, in a horizontal cross-sectional view, the via protective layer has a band shape surrounding the through-electrode, and
   wherein the via protective layer includes polyimide, polyhydroxystyrene, polybenzoxazole, or polyamide.

2. The semiconductor device of claim 1, wherein a width of a top surface of the via protective layer is 10 µm or less.

3. The semiconductor device of claim 1, wherein a depth from a top surface of the via protective layer to a lower end thereof is 0.3 µm or less.

4. The semiconductor device of claim 1, wherein the via passivation layer includes a lower passivation layer and an upper passivation layer disposed on the lower passivation layer.

5. The semiconductor device of claim 4,
   wherein the lower passivation layer includes a lower horizontal portion extending in a horizontal direction on the inactive surface and a lower vertical portion in contact with the through-electrode, and
   wherein the upper passivation layer includes an upper horizontal portion extending in a horizontal direction on the lower horizontal portion and an upper vertical portion in contact with the lower vertical portion.

6. The semiconductor device of claim 5,
   wherein, in a horizontal cross-sectional view, the lower vertical portion surrounds the through-electrode, and
   wherein the upper vertical portion surrounds the lower vertical portion.

7. The semiconductor device of claim 5, wherein, in a horizontal cross-sectional view, the upper horizontal portion surrounds the via protective layer.

8. The semiconductor device of claim 5, wherein top surfaces of the through-electrode, the lower vertical portion, the upper vertical portion, the via protective layer, and the upper horizontal portion are coplanar with each other.

9. The semiconductor device of claim 5, wherein the concave portion is formed in a corner between the upper horizontal portion and the upper vertical portion.

10. The semiconductor device of claim 1, further comprising:
    a conductive pad connected to the through-electrode on the via passivation layer,
    wherein an outer diameter of the via protective layer is larger than a horizontal width of the conductive pad.

11. The semiconductor device of claim 1, wherein, in a horizontal cross-sectional view, the via protective layer has a second width larger than a first width.

12. The semiconductor device of claim 1, wherein, in a horizontal cross-sectional view, the via protective layer includes a plurality of protruding portions and a plurality of depressed portions.

13. A semiconductor device comprising:
    a via passivation layer disposed on an inactive surface of a substrate;

a first through-electrode and a second through-electrode vertically penetrating the substrate and the via passivation layer, the second through-electrode having a horizontal width larger than a horizontal width of the first through-electrode;
a first concave portion and a second concave portion formed in a top surface of the via passivation layer, the first concave portion being adjacent to the first through-electrode and the second concave portion being adjacent to the second through-electrode;
a first via protective layer filling the first concave portion; and
a second via protective layer filling the second concave portion,
wherein, in a horizontal cross-sectional view, the first via protective layer and the second via protective layer have band shapes surrounding the first through-electrode and the second through-electrode, respectively.

14. The semiconductor device of claim 13, wherein, in a horizontal cross-sectional view, an inner diameter of the second via protective layer is larger than an inner diameter of the first via protective layer.

15. The semiconductor device of claim 13, wherein, in a horizontal cross-sectional view, a width of the second via protective layer is larger than a width of the first via protective layer.

16. The semiconductor device of claim 13, wherein top surfaces of the via passivation layer, the first through-electrode, the second through-electrode, the first via protective layer, and the second via protective layer are coplanar with each other.

17. The semiconductor device of claim 13, wherein the via passivation layer includes a lower passivation layer and an upper passivation layer disposed on the lower passivation layer.

18. The semiconductor device of claim 17,
wherein the lower passivation layer includes a lower horizontal portion extending in a horizontal direction on the inactive surface, a first lower vertical portion in contact with the first through-electrode, and a second lower vertical portion in contact with the second through-electrode, and
wherein the upper passivation layer includes an upper horizontal portion extending in the horizontal direction on the lower horizontal portion, a first upper vertical portion in contact with the first lower vertical portion, and a second upper vertical portion in contact with the second lower vertical portion.

19. A semiconductor device comprising:
a substrate including an inactive surface and an active surface opposite the inactive surface;
an interlayer insulating layer disposed below the active surface;
a wiring structure disposed below the interlayer insulating layer;
a lower passivation layer including a lower horizontal portion disposed on the inactive surface, a lower vertical portion connected to the lower horizontal portion, and a lower concave portion formed between the lower horizontal portion and the lower vertical portion;
an upper passivation layer disposed on the lower passivation layer, the upper passivation layer including an upper horizontal portion disposed on the lower horizontal portion, an upper vertical portion connected to the upper horizontal portion, and an upper concave portion formed between the upper horizontal portion and the upper vertical portion, the upper vertical portion being in contact with a side surface of the lower vertical portion;
a through-electrode vertically penetrating the substrate, the lower passivation layer, the upper passivation layer, and the interlayer insulating layer; and
a via protective layer horizontally overlapping the upper horizontal portion, the upper vertical portion, and the through-electrode and to fill the upper concave portion,
wherein, in a horizontal cross-sectional view, the via protective layer has a band shape surrounding the through-electrode.

* * * * *